US008624317B2

(12) United States Patent
Arai et al.

(10) Patent No.: US 8,624,317 B2
(45) Date of Patent: Jan. 7, 2014

(54) NONVOLATILE SEMICONDUCTOR MEMORY DEVICE AND METHOD FOR MANUFACTURING SAME

(75) Inventors: Fumitaka Arai, Yokkaichi (JP); Satoshi Nagashima, Yokkaichi (JP); Hisataka Meguro, Yokkaichi (JP); Hideto Takekida, Nagoya (JP); Kenta Yamada, Nagoya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/402,477

(22) Filed: Feb. 22, 2012

(65) Prior Publication Data
US 2012/0217571 A1 Aug. 30, 2012

(30) Foreign Application Priority Data

Feb. 25, 2011 (JP) ................................. 2011-040918

(51) Int. Cl.
*H01L 29/792* (2006.01)
(52) U.S. Cl.
USPC ........................... 257/324; 257/314; 257/319
(58) Field of Classification Search
USPC ......... 257/314, 315, 316, 317, 318, 319, 324, 257/261
See application file for complete search history.

(56) References Cited

U.S. PATENT DOCUMENTS

| 7,020,025 | B2 | 3/2006 | Sato et al. | |
| 7,078,763 | B2* | 7/2006 | Arai et al. | 257/320 |
| 7,553,728 | B2 | 6/2009 | Mizukami et al. | |
| 7,936,004 | B2 | 5/2011 | Kito et al. | |
| 2006/0060911 | A1* | 3/2006 | Sakuma et al. | 257/315 |
| 2006/0186464 | A1* | 8/2006 | Sakuma et al. | 257/316 |
| 2007/0128815 | A1* | 6/2007 | Iino et al. | 438/297 |

(Continued)

FOREIGN PATENT DOCUMENTS

| JP | 6-77500 | 3/1994 |
| JP | 2004-319948 | 11/2004 |
| JP | 2005-100501 | 4/2005 |
| JP | 2007-157854 | 6/2007 |
| JP | 2007-266143 | 10/2007 |
| JP | 2008-140912 | 6/2008 |

OTHER PUBLICATIONS

U.S. Appl. No. 13/601,468, filed Aug. 31, 2012, Nagashima.
U.S. Appl. No. 13/600,991, filed Aug. 31, 2012, Sakamoto, et al.

(Continued)

*Primary Examiner* — Sandra Smith
*Assistant Examiner* — Sophia Nguyen
(74) *Attorney, Agent, or Firm* — Oblon, Spivak, McClelland, Maier & Neustadt, L.L.P.

(57) ABSTRACT

Nonvolatile semiconductor memory device includes first memory cell array layer, first insulating layer formed thereabove, and second memory cell array layer formed thereabove. First memory cell array layer includes first NAND cell units each including plural first memory cells. The first memory cell includes first semiconductor layer, first gate insulating film formed thereabove, and first charge accumulation layer formed thereabove. The second memory cell array layer includes second NAND cell units each including plural second memory cells. The second memory cell includes second charge accumulation layer, second gate insulating film formed thereabove, and second semiconductor layer formed thereabove. Control gates are formed, via an inter-gate insulating film, on first-direction both sides of the first and second charge accumulation layers positioned the latter above the former via the first insulating layer. The control gates extend in a second direction perpendicular to the first direction.

20 Claims, 41 Drawing Sheets

(56) References Cited

U.S. PATENT DOCUMENTS

2008/0128780 A1\* 6/2008 Nishihara et al. ............ 257/316
2008/0259687 A1\* 10/2008 Specht et al. ............ 365/185.17
2010/0207194 A1\* 8/2010 Tanaka et al. ................. 257/324
2010/0270607 A1\* 10/2010 Kinoshita et al. ............ 257/316
2010/0323505 A1\* 12/2010 Ishikawa et al. ............. 438/492
2011/0287597 A1\* 11/2011 Kito et al. .................... 438/261

(Continued)

OTHER PUBLICATIONS

Japanese Office Action for Patent Application No. 2011-040918 mailed Jun. 11, 2013 (with English Translation).

\* cited by examiner

GC Direction

GC Direction

GC Direction

GC Direction

GC Direction

NONVOLATILE SEMICONDUCTOR MEMORY DEVICE AND METHOD FOR MANUFACTURING SAME

CROSS REFERENCE TO RELATED APPLICATIONS

This application is based on and claims the benefit of priority from prior Japanese Patent Application No. 2011-40918, filed on Feb. 25, 2011, the entire contents of which are incorporated herein by reference.

FIELD

Embodiments described herein relate generally to a nonvolatile semiconductor memory device and a method for manufacturing the same.

BACKGROUND

Description of the Related Art

NAND type flash memories are known as electrically rewritable and highly integrable nonvolatile semiconductor memory devices. Memory transistors of conventional NAND type flash memories have a stacked-gate structure in which a charge accumulation layer (floating gate) and a control gate are stacked via an insulation film. A NAND cell unit is configured by a plurality of memory transistors connected in series in a column direction with adjoining ones sharing their source and drain, and select gate transistors provided at the ends of the column of memory transistors. One end of the NAND cell unit is connected to a bit line, and the other end thereof is connected to a source line. A memory cell array is configured by NAND cell units arranged in a matrix. NAND cell units arranged in a row direction are referred to as a NAND cell block. The gates of select gate transistors arranged in the same row are connected to the same select gate line, and the control gates of memory transistors arranged in the same row constitute a word line. When N memory transistors are connected in series in a NAND cell unit, the number of word lines included in one NAND cell block is N.

Miniaturization of the NAND type flash memories has reduced the gate length and the interval between adjoining transistors, which has brought about various problems described below. For example, these problems are (a) reduction in drain current controllability based on an electric field of the control gate due to increase in parasitic capacitance between adjoining gates, etc., short channel effect (SCE), etc., (b) increase in an interference effect between adjoining gates, (c) increase in a leak current between adjoining electrodes, (d) leaning or collapsing of patterns during fabrication of the gates because of an increasing aspect ratio of the gate electrodes, (e) deterioration of data retention characteristics due to a significant reduction in the number of electrons that can be accumulated in the charge accumulation layer (the number of electrons per bit), etc. Hence, conventional NAND type flash memories have almost reached the physical limit of miniaturization, with a significantly narrowed writing/erasing window of the memory cells.

"Three-dimensionally stacked" memories, in which memory cell transistors are stacked sterically to form many layers, are considered to be the main method for future integration. Specifically, a structure in which nitride film trap type (SONOS, MONOS) cells are stacked is proposed in many papers, etc. The nitride film trap type cell structure has a merit in that it can be manufactured (stacked) easily, but its major problem is that its erasing characteristic and data retention characteristic are poorer than those of the floating gate type cell because of its nature of trapping electrons in the nitride film.

On the other hand, the conventional floating gate type memory cell structure for accumulating charges in the floating gate electrode is difficult to manufacture and stack, because it has an EB (Etch Back) structure in which a control gate electrode and an IPD film (Inter-Poly-Dielectric film or inter-gate insulating film) are provided not only over the upper surface of the floating gate electrode but also over the side surfaces thereof for securing a drive power (coupling ratio) of the control gate electrode. Further, according to one method for increasing the coupling ratio in order to widen the writing/erasing window of the memory cells, it is necessary to increase the thickness of the floating gate electrode. However, if the thickness of the floating gate electrode is increased in the EB structure in which the IPD film and the control gate electrode are stacked above the floating gate electrode, the word line is consequently raised upward and the aspect ratio is increased, exposing the problem (d) described above. Therefore, it is not easy to improve the coupling ratio.

Hence, as a cell structure for securing coupling ratio without extreme difficulty of manufacture, other than the stacked gate structure, the following structure has already been proposed. That is, in this structure, each control gate electrode is embedded between floating gates via an inter-gate insulating film such that the control gate electrode extends along the word line direction. This structure secures the coupling ratio by raising the potential of a writing target cell through the control gate electrodes on both sides of the target cell.

However, as for these memory cells, simply stacking them means a simple increase in the number of manufacturing steps, and it is hence difficult to reduce the bit cost while ensuring an increase in the cell capacity that is balanced with the cost increase. Simple stacking is effective only by a bit cost shrink ratio=1/the number of stacked layers, i.e., the division by the number of layers, which means that the shrink ratio is small when the number of layers is large, leading to a high bit cost. Therefore, in the cell structure seeking a shrink by stacking, an object from a practical standpoint is to restrict the number of steps and the cost.

DETAILED DESCRIPTION

A nonvolatile semiconductor memory device according to an embodiment includes a first memory cell array layer, a first insulating layer formed above the first memory cell array layer, and a second memory cell array layer formed above the first insulating layer. The first memory cell array layer includes first NAND cell units each including a plurality of first memory cells connected in series in a first direction. The first memory cell includes a first semiconductor layer, a first gate insulating film formed above the first semiconductor layer, and a first charge accumulation layer formed above the first gate insulating film. The second memory cell array layer includes second NAND cell units each including a plurality of second memory cells connected in series in the first direction. The second memory cell includes a second charge accumulation layer, a second gate insulating film formed above the second charge accumulation layer, and a second semiconductor layer formed above the second gate insulating film. Control gate are formed on the first-direction both sides of the first and second charge accumulation layers which are positioned the latter above the former via the first insulating layer, with an inter-gate insulating film provided between the control gate and the charge accumulation layers. The control gates extend in a second direction perpendicular to the first direction.

The embodiment will now be explained with reference to the attached drawings.

[Basic Memory Cell Array Structure]

Before a first embodiment will be explained, a memory cell structure of a NAND type flash memory which forms the basis of the nonvolatile semiconductor memory device according to the present embodiment will be explained.

As a cell structure for securing coupling between a floating gate (charge accumulation layer) and a control gate, the present embodiment has not the stacked-gate structure but a gate structure in which control gates are embedded at both sides of a floating gate to let the floating gate couple with the control gates on both sides thereof.

Figure 43:
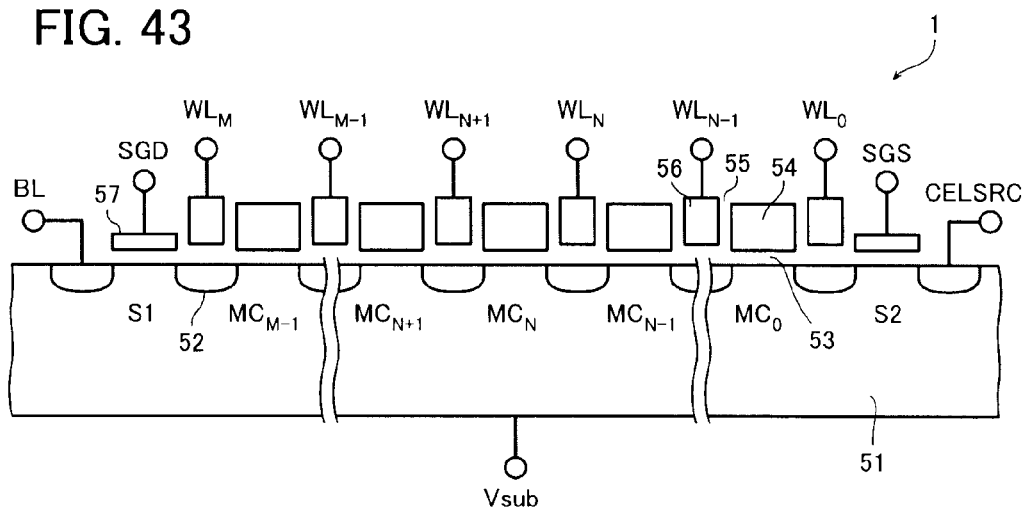
FIG. 43 is a diagram showing a memory cell array structure of a NAND type flash memory according to a comparative example.
Figure 44:
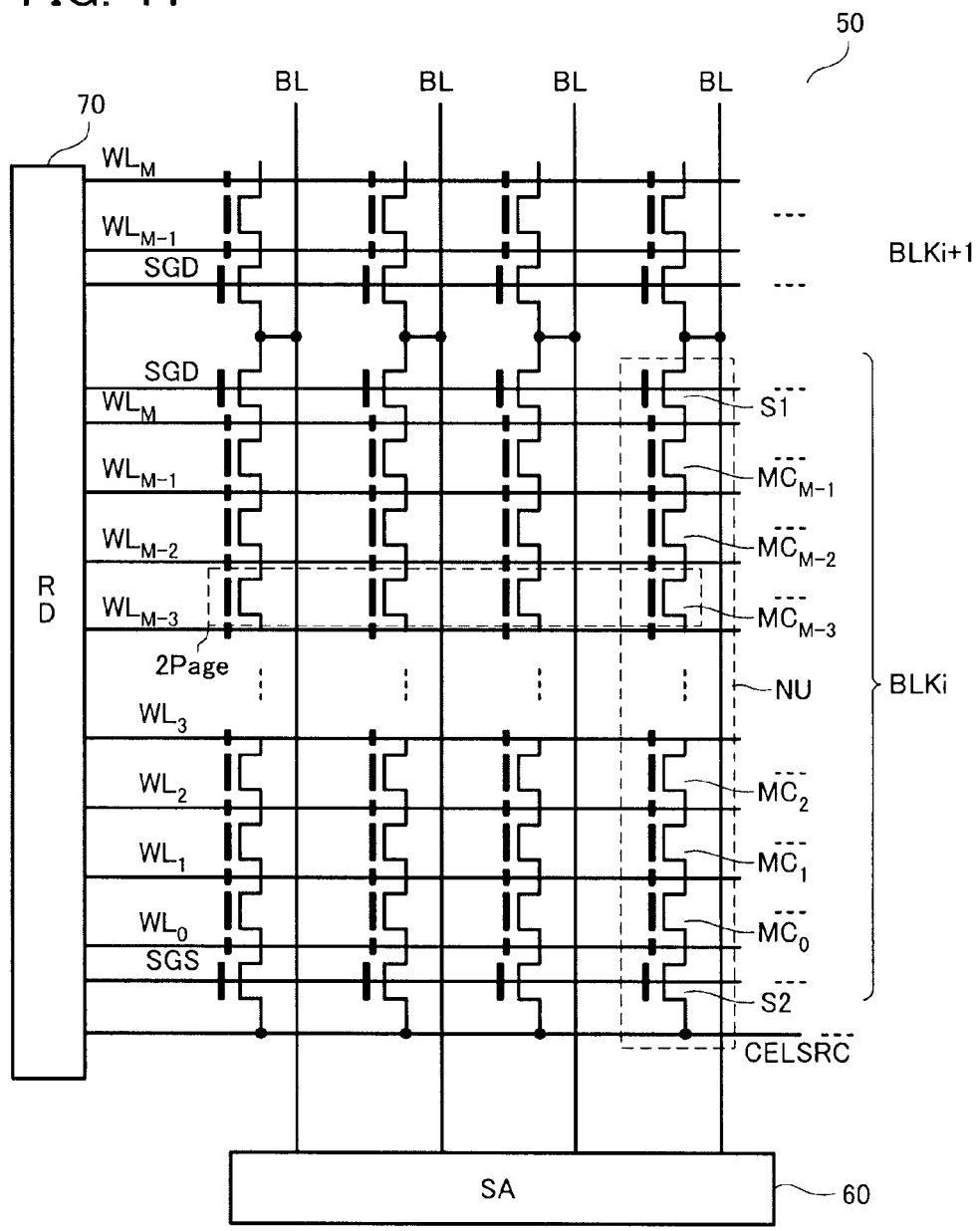
FIG. 44 is an equivalent circuit diagram of the memory cell array of the NAND type flash memory according to the comparative example.

FIG. 43 is a diagram showing the structure of a memory cell array 1 of a NAND type flash memory according to a comparative example which employs this structure. FIG. 44 is a circuit diagram of this memory cell array 1.

A memory cell array 50 includes a plurality of NAND cell units NU each including: a NAND string configured by M number of electrically-rewritable nonvolatile memory cells $MC_0$ to $MC_{M-1}$ connected in series; and select gate transistors S1 and S2 connected to both ends of the NAND string. One end of the NAND cell unit NU (that is on the select gate transistor S1 side) is connected to a bit line BL, and the other end thereof (that is on the select gate transistor S2 side) is connected to a common source line CELSRC. The gate electrodes of the select gate transistors S1 and S2 are connected to select gate lines SGD and SGS. The control gate electrodes provided on both sides of the memory cells $MC_0$ to $MC_{M-1}$ are connected to word lines $WL_0$ to $WL_M$ respectively. The bit lines BL are connected to a sense amplifier circuit 60, and the word lines $WL_0$ to $WL_M$ and the select gate lines SGD and SGS are connected to a row decoder circuit 70.

n type diffusion layers 52 to function as sources and drains of MOSFETs constituting the memory cells MC are formed in a p-type well 51 formed in a substrate. Floating gates (FG) 54 are formed above the well 51 via a gate insulating film 53 functioning as a tunnel insulating film. The floating gates 54 function as charge accumulation layers. Control gates (CG) 56 are formed on both sides of the floating electrodes 54 via an inter-gate insulating film (IPD) 55. The control gates 56 constitute the word lines WL. The select gate transistors S1 and S2 have select gates 57 above the well 51 via the gate insulating film 53. The select gates 57 constitute the select gate lines SGS and SGD. The memory cells MC and the select gate transistors S1 and S2 are NAND-connected such that adjoining ones share their drain and source.

In the case of 1 bit/cell where data of 1 bit is stored in one memory cell MC, data of 1 page is stored in the memory cells MC formed along a pair of word lines WL perpendicular to a NAND cell unit NU. In the case of 2 bits/cell where data of 2 bits is stored in one memory cell MC, data of 2 pages (an upper page UPPER and a lower page LOWER) is stored in the memory cells MC formed along a word line WL.

One block BLK includes a plurality of NAND cell units NU that share word lines WL. One block BLK forms a unit of data erasing operation. In one memory cell array 1, the number of word lines WL in one block BLK is M+1, and the number of pages in one block is M×2=128 pages in the case of two bits/cell (in case of M=64).

When writing data into a writing target memory cell MC, the voltage of the control gates 56 on both sides of the floating gate 54 is raised to a certain writing voltage, and other control gates 56 in the NAND cell unit NU are set to alternate low and high voltages which decrease toward both ends of the NAND cell unit NU, to thereby prevent non-selected memory cells from being written erroneously.

First Embodiment

[Memory Cell Array Structure According to Fist Embodiment]

Next, the memory cell array structure according to the first embodiment will be explained.

Figure 1:
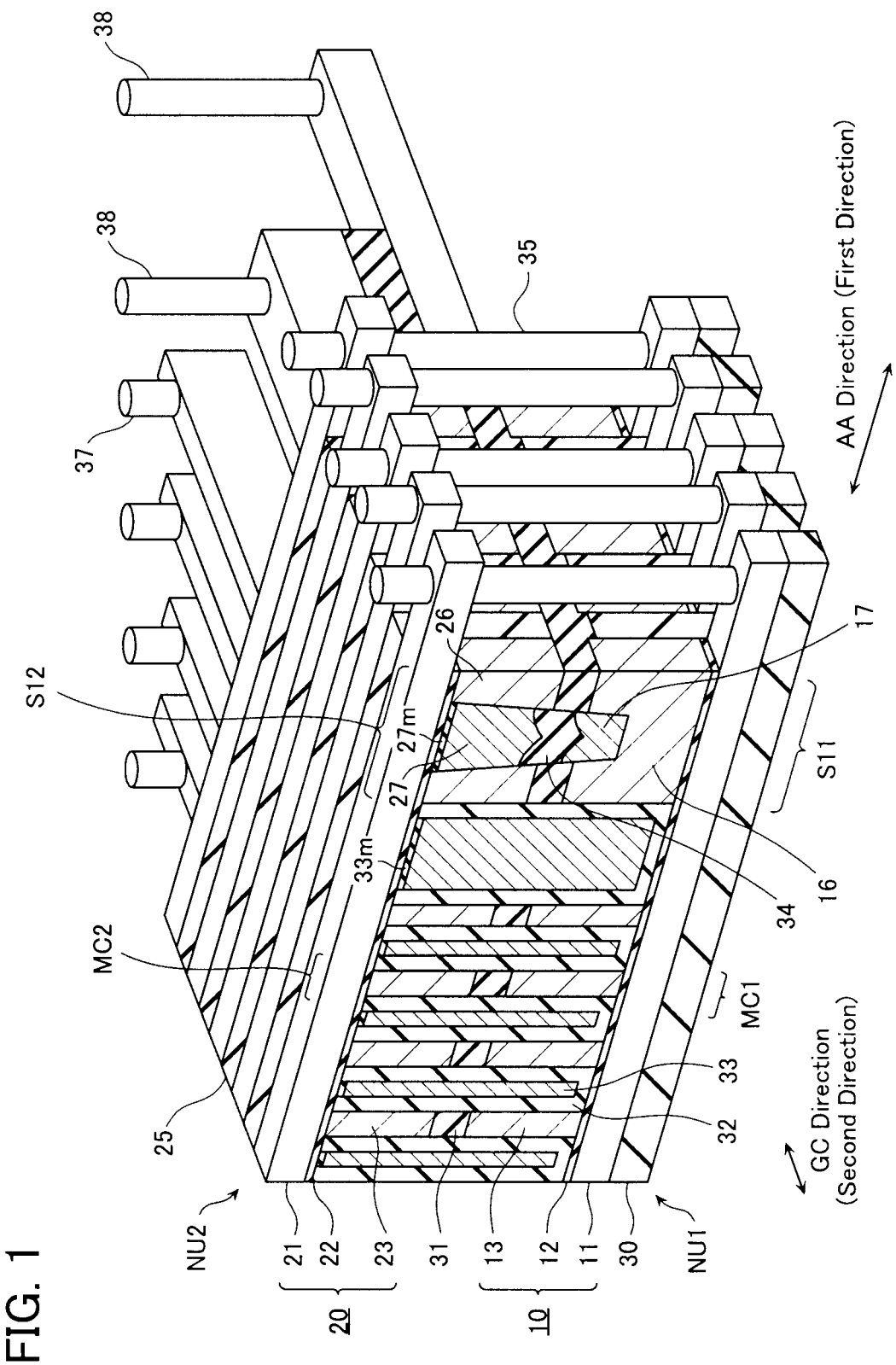
FIG. 1 is a perspective diagram showing a memory cell array structure of a nonvolatile semiconductor memory device according to a first embodiment.
Figure 2:
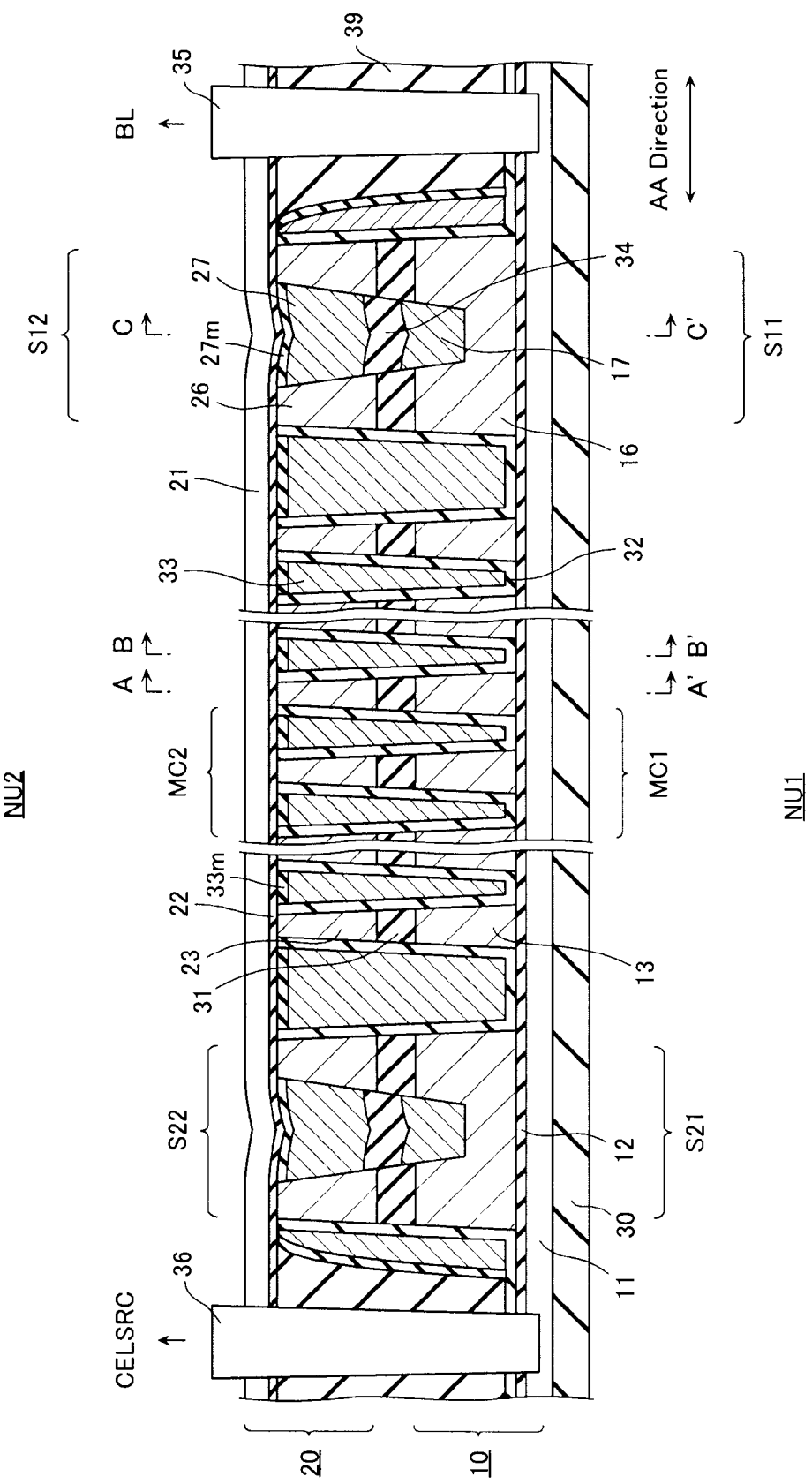
FIG. 2 is a cross-sectional diagram showing the memory cell array structure seen from a GC direction.
Figures 3A, 3B, 3C:
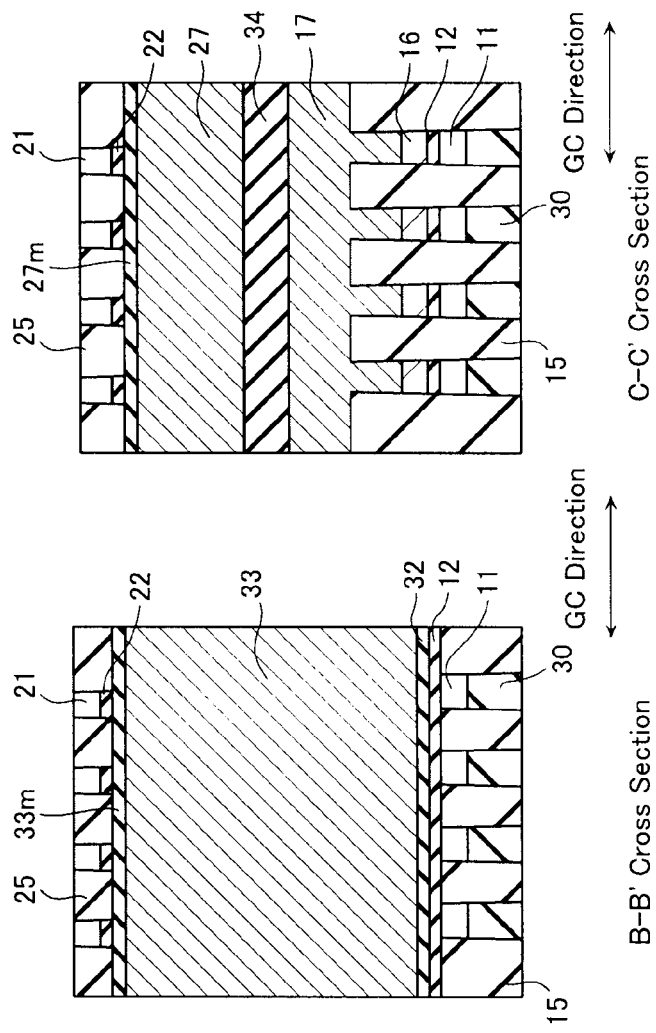
FIGS. 3A, 3B, and 3C are cross-sectional diagrams of FIG. 2 taken along lines A-A', B-B', and C-C', respectively.

FIG. 1 is a perspective diagram of the memory cell array structure according to the first embodiment. FIG. 2 is a cross-sectional diagram of FIG. 1 seen from the GC (gate) direction. FIG. 3 are cross-sectional diagrams of FIG. 2 taken along lines A-A', B-B', and C-C' and seen from the AA (active area) direction of FIG. 1. Note that the drawings are illustrated with some components omitted, in order to make the internal structure visible.

In this memory cell array structure, memory cell arrays shown in FIG. 43 are stacked head-to-head, and control gates are shared by these upper and lower memory cell array layers.

That is, as shown in FIG. 1, a lower first semiconductor layer 11 and an upper second semiconductor layer 21 to constitute bodies to form channels are provided above an insulating base 30, and between them, a first floating gate 13 (charge accumulation layer) to face the upper surface of the first semiconductor layer 11 via a first tunnel insulating film (first gate insulating film) 12 and a second floating gate (charge accumulation layer) 23 to face the lower surface of the second semiconductor layer 21 via a second tunnel insulating film (second gate insulating film) 22 are stacked the latter above the former via a first insulating layer 31. As is clear from the A-A' cross section of FIG. 3A, the semiconductor layers 11 or 21, the tunnel insulating films 12 or 22, and the floating gates 13 or 23 are insulated and isolated from each other in the GC direction (second direction) via element isolating insulating films 15 or 25 extending in the AA direction (first direction).

A plurality of stacks of floating gates 13 and 23 are formed at certain intervals in the AA direction along the semiconductor layers 11 and 21 so as to form a NAND array. Control gates 33 extending in the GC direction are formed on AA-direction both sides of each stack of floating gates 13 and 23 via an inter-gate insulating film (IPD: Inter-Poly Dielectric film) 32. The control gate 33 is provided commonly for the lower and upper floating gates 13 and 23 so as to couple with these floating gates 13 and 23 from their side. A mask material 33m is provided between the control gate 33 and the second tunnel insulating film 22. The lower first semiconductor layer 11, the first tunnel insulating film 12, the first floating gate 13, the inter-gate insulating film 32, and the control gates 33 are included in the configuration of a lower first memory cell MC1. The upper second semiconductor layer 21, the second tunnel insulating film 22, the second floating gate 23, the inter-gate insulating film 32, and the control gates 33 are included in the configuration of an upper second memory cell MC2.

First select gates 16 and second select gates 26 to form select gate transistors S11 and S12, and S21 and S22 are provided at positions adjoining the control gates 33 which are located at both ends of the arrangement of stacks of floating gates 13 and 23. The select gates 16 and 26 are stacked the latter above the former via the first insulating layer 31, and face the semiconductor layers 11 and 21 via the tunnel insulating films 12 and 22 respectively. First select gate lines 17 extending in the GC direction are embedded in the first select gates 16, and second select gate lines 27 and mask materials 27m extending in the GC direction are embedded in the second select gates 26. The select gate line 17 and the select gate line 27 are insulated and isolated from each other via a second insulating layer 34.

A lower first NAND cell unit NU1 includes lower NAND-connected memory cells MC1 and the select gate transistors S11 and S21, and a first memory cell array layer 10 includes a plurality of NAND cell units NU1 which are arranged in the GC direction. An upper second NAND cell unit NU2 includes the upper NAND-connected memory cells MC2 and the select gate transistors S12 and S22, and a second memory cell array layer 20 includes a plurality of NAND cell units NU2 which are arranged in the GC direction.

A bit line contact 35 shared between the NAND cell units NU1 and NU2 and extending vertically to connect to an unillustrated bit line is formed in the semiconductor layers 11 and 21 at one end of the NAND cell units NU1 and NU2. A source line contact 36 shared between the NAND cell units NU1 and NU2 and extending vertically to connect to an unillustrated source line is formed in the semiconductor layers 11 and 21 at the other end of the NAND cell units NU1 and NU2. A word line contact 37 is formed at an end of the control gate 33, and a select gate line contact 38 is formed at an end of the select gate lines 17 and 27.

Figure 4:
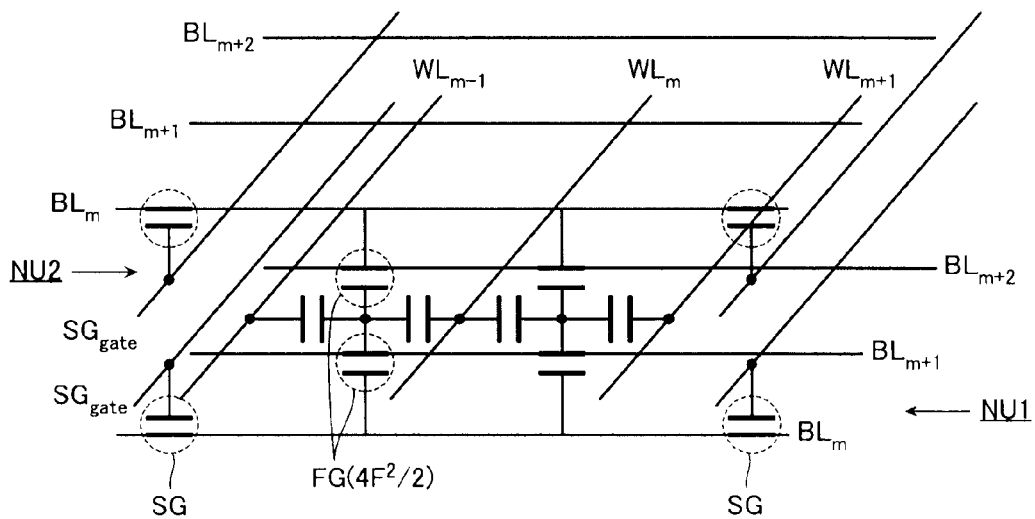
FIG. 4 is an equivalent circuit diagram of the memory cell array.

According to the above configuration, the floating gates 23 of vertically corresponding memory cells MC1 and MC2 of the lower and upper NAND cell units NU1 and NU2 are simultaneously driven by coupling with the word lines WL on both sides to be connected to a common bit line, as their equivalent circuit is shown in FIG. 4. In contrast, the select gate transistors S11 to S22 are provided independently for the lower and upper bit lines, and can selectively activate the NAND cell unit NU1 or NU2 by either one being selected.

As can be understood from the above, the present embodiment employs a method for executing writing by raising the potential of the floating gates 13 and 23 through the control gates 33 on both sides of the floating gates 13 and 23, and hence does not have such an EB (Etch Back) structure as that of the floating gate type cells of the comparative example that is difficult to manufacture. Therefore, the present embodiment is less difficult to manufacture, and thus realizes a cell structure that is suitable for stacking.

When a higher coupling ratio is needed to widen the writing/erasing window of the memory cells MC, it is necessary to increase the thickness of the floating gate. According to the present embodiment, the control gates 33 are provided on both sides of the floating gates 13 and 23 via the inter-gate insulating film 32, and the floating gate and the control gate are not provided in a stacked structure. Therefore, thickening of the floating gate is easy, and the coupling ratio can be increased while the word lines are maintained at a low aspect. This is advantageous for the problem of pattern leaning and collapsing, etc. during fabrication of the gates. As regards the bit cost problem too, because the word lines for the upper cells and lower cells can be manufactured simultaneously as will be shown in the following manufacturing flow, it is possible to reduce the number of steps and to reduce critical lithography steps of which unit process price is high, making it possible to restrict the bit cost. Hence, the structure proposed here is advantageous for the various problems of stacking.

[Method for Manufacturing Memory Cell Array Structure according to First Embodiment]

Next, a method for manufacturing the memory cell array according to the present embodiment will be explained.

First, there are some conceivable variations regarding the formation of a peripheral circuit region. When the formation is on a bulk silicon substrate, it is necessary to form the peripheral circuits first. At this time, it is also possible to simultaneously form the memory cell arrays according to the present embodiment on the bulk silicon substrate. In the present embodiment, the NAND cell units NU1 and NU2 are provided sterically. Hence, an example of forming NAND cell units NU1 and NU2 above a silicon substrate will be explained. The method for forming peripheral circuit transistors is the same as an ordinary method. That is, first, a channel is formed above a silicon substrate. Then, gate oxide films (both a Low Voltage oxide film and a High Voltage oxide film) are formed above the silicon substrate. Then, after a gate electrode and a mask material for AA (active area) formation are stacked, an STI trench is formed. Then, after the STI trench is filled, a mask material for GC (gate) formation is stacked, GC electrodes are formed, and a side wall insulating film is formed. After this, a source/drain diffusion layer is formed, an inter-GC insulating film is embedded, and the surface is planarized.

After the peripheral circuits are formed, the memory cell array according to the present embodiment is formed as their overlying layer. FIG. 5 to FIG. 20 are diagrams showing the method for manufacturing the memory cell array according to the present embodiment.

Figure 5:
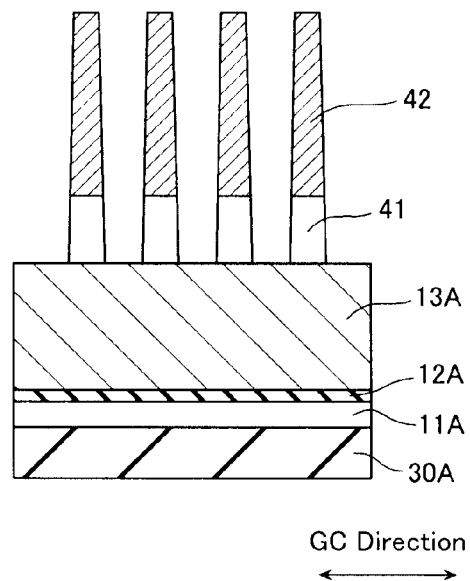
FIG. 5 is a cross-sectional diagram showing a step of manufacturing the memory cell array.

First, as shown in FIG. 5, an insulating layer 30A made of $SiO_2$ is formed above an unillustrated silicon substrate, and above them, a first semiconductor layer 11A made of polysilicon, a first tunnel insulating film (gate insulating film) 12A made of $SiO_2$, and a first floating gate forming layer 13A made of polysilicon are stacked sequentially. The first semiconductor layer 11A to become a channel (body) is basically made of polysilicon, but may be made of monocrystal silicon. In the present embodiment, by using polysilicon for the channel (body) so as to form an SOI structure, it becomes unnecessary to form an STI in the silicon substrate, which realizes a cell structure that is more suitable for stacking. Since formation of the tunnel insulating film 12A is carried out above the semiconductor layer 11A made of polysilicon, it is done by using not a thermally-oxidized film, but a CVD (Chemical Vapor Deposition) or an ALD (Atomic Layer Deposition) oxide film. Note that although the first semiconductor layer 11A is provided by film formation as described above, it may instead be a silicon substrate as it is.

Figure 6:
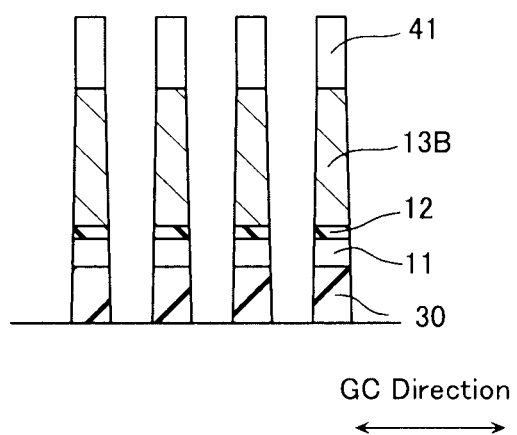
FIG. 6 is a cross-sectional diagram showing a step of manufacturing the memory cell array.

After the layers up to the first floating gate forming layer 13A are formed, mask materials 41 and 42 for AA pattern formation made of, e.g., SiN and $SiO_2$ are patterned onto the first floating gate forming layer 13A. RIE (Reactive Ion Etching) using the mask materials 41 and 42 is carried out to selectively etch the stack of layers to the bottom of the insulating layer 30A to form first trenches to thereby form the AA pattern as shown in FIG. 6. As a result, a first floating gate forming layer 13B, a first gate insulating film 12, a first semiconductor layer 11, and an insulating layer 30 are formed.

Figure 7:
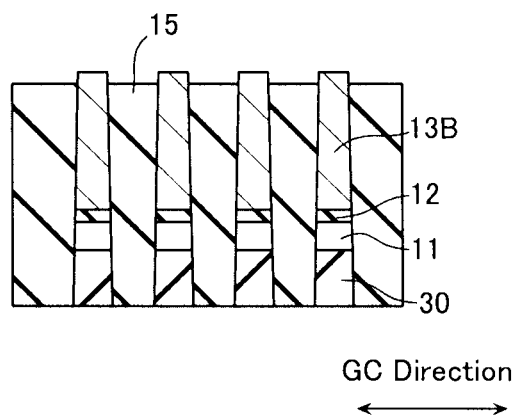
FIG. 7 is a cross-sectional diagram showing a step of manufacturing the memory cell array.
Figure 8:
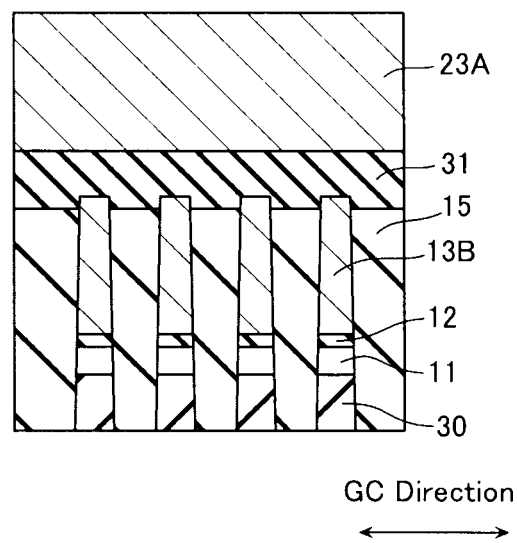
FIG. 8 is a cross-sectional diagram showing a step of manufacturing the memory cell array.

Next, as shown in FIG. 7, the trenches formed by the AA pattern formation are filled with a first element isolating insulating layer 15 made of $SiO_2$, and then planarization is carried out by CMP (Chemical Mechanical Polishing) using the polysilicon forming the first floating gate forming layer 13B as the stopper. Then, the upper surface of the first element isolating insulating layer 15 is set back by etch back. Next, as shown in FIG. 8, a first insulating layer 31 for isolating the upper layer from the lower layer is formed above the first element isolating insulating layer 15 and the first floating gate forming layer 13B, and a second floating gate forming layer 23A made of polysilicon is formed above the first insulating layer 31.

Figure 9:
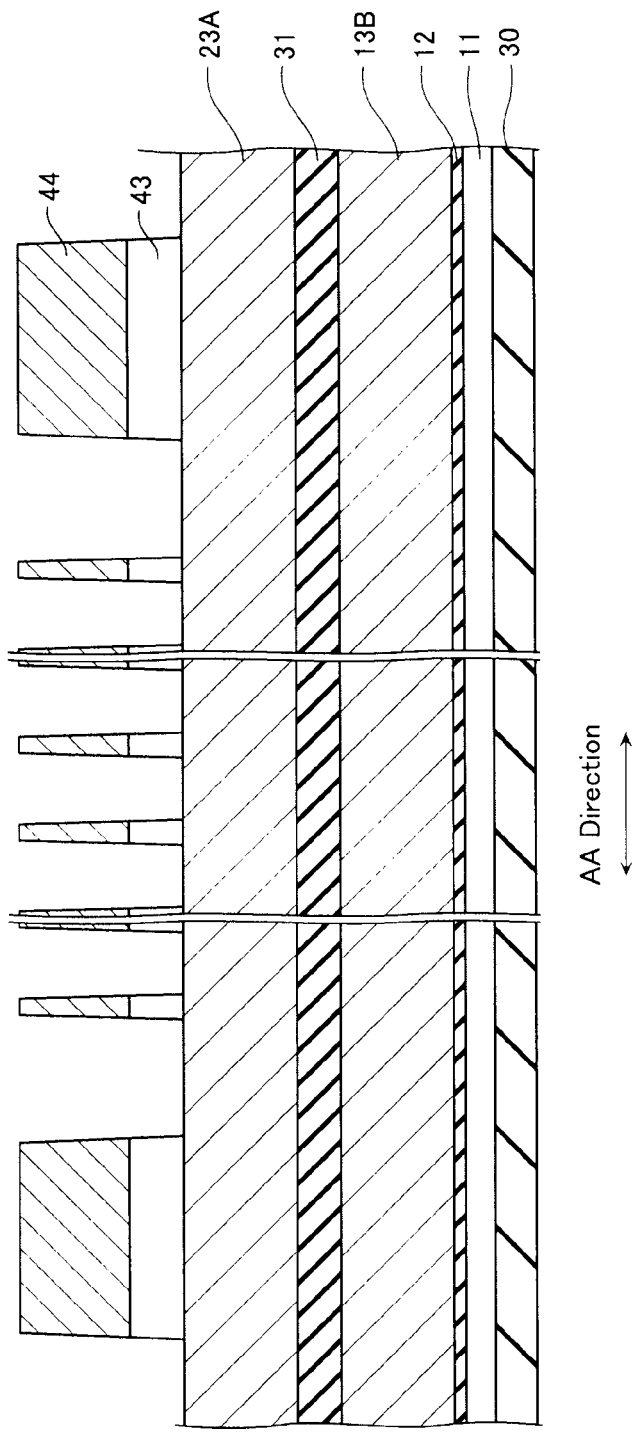
FIG. 9 is a cross-sectional diagram showing a step of manufacturing the memory cell array.
Figure 10:
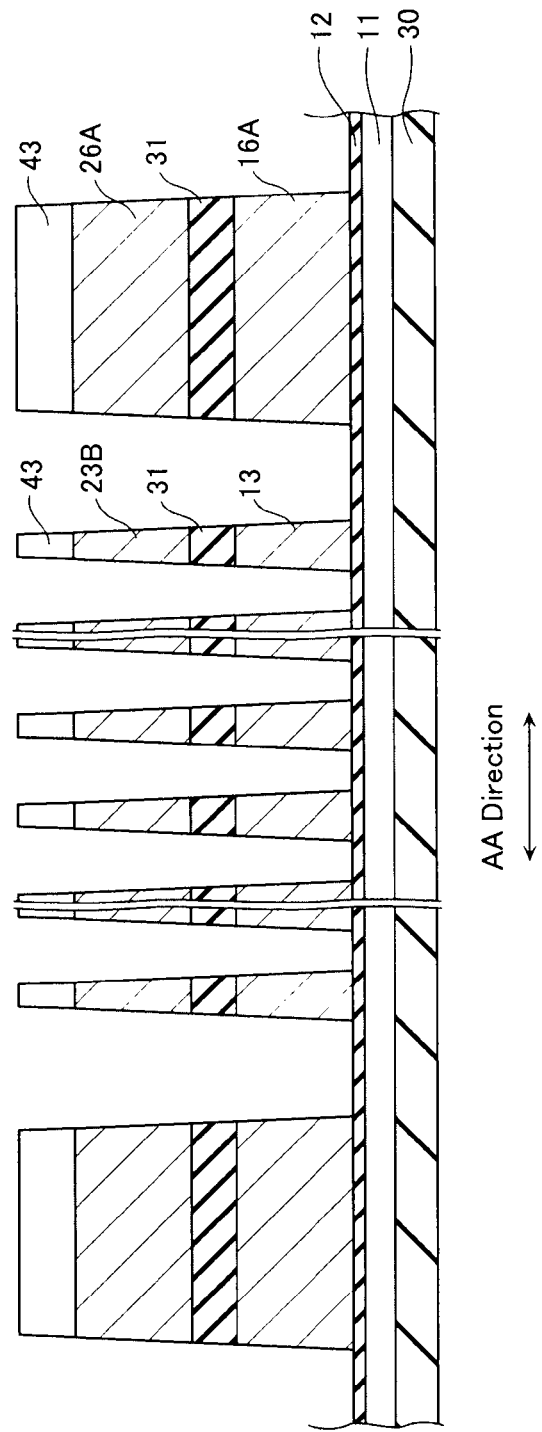
FIG. 10 is a cross-sectional diagram showing a step of manufacturing the memory cell array.

Then, as shown in FIG. 9, mask materials 43 and 44 for GC pattern formation made of, e.g., SiN and $SiO_2$ are patterned onto the second floating gate forming layer 23A. Then, as shown in FIG. 10, the stack of layers is selectively etched to the top of the tunnel insulating film 12 by RIE using the mask materials 43 and 44, to form second trenches and thereby form the GC pattern. As a result, a first floating gate 13, a second floating gate forming layer 23B, a first select gate forming layer 16A, and a second select gate forming layer 26A are formed. It is preferable that this GC pattern formation be carried out by an etching process having a high selectivity toward the tunnel insulating film 12 of the lower layer and that the first semiconductor layer 11 of the lower layer be not etched.

Figure 11:
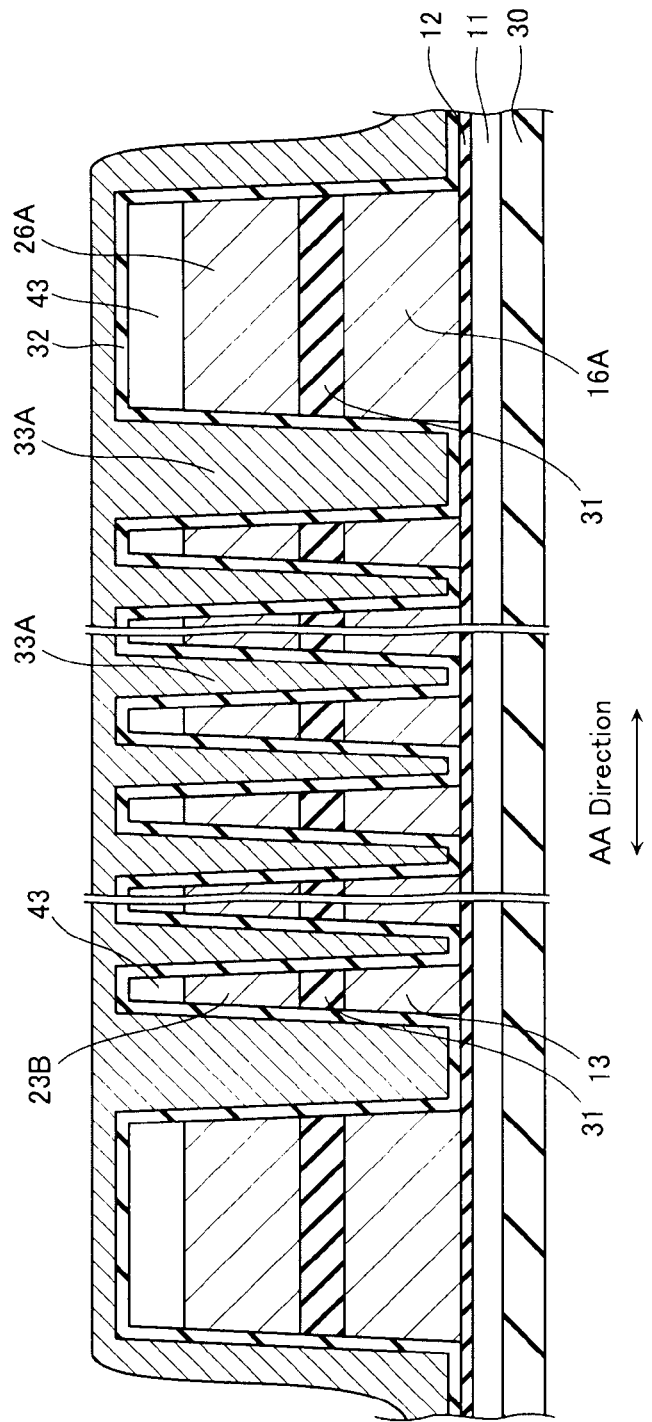
FIG. 11 is a cross-sectional diagram showing a step of manufacturing the memory cell array.

Then, as shown in FIG. 11, after an inter-gate insulating film (IPD) 32 made of $SiO_2$ is formed, the trenches of the GC pattern are filled with a control gate forming layer 33A. The control gate forming layer 33A may be made of polysilicon or metal (W, etc.)

Figure 12:
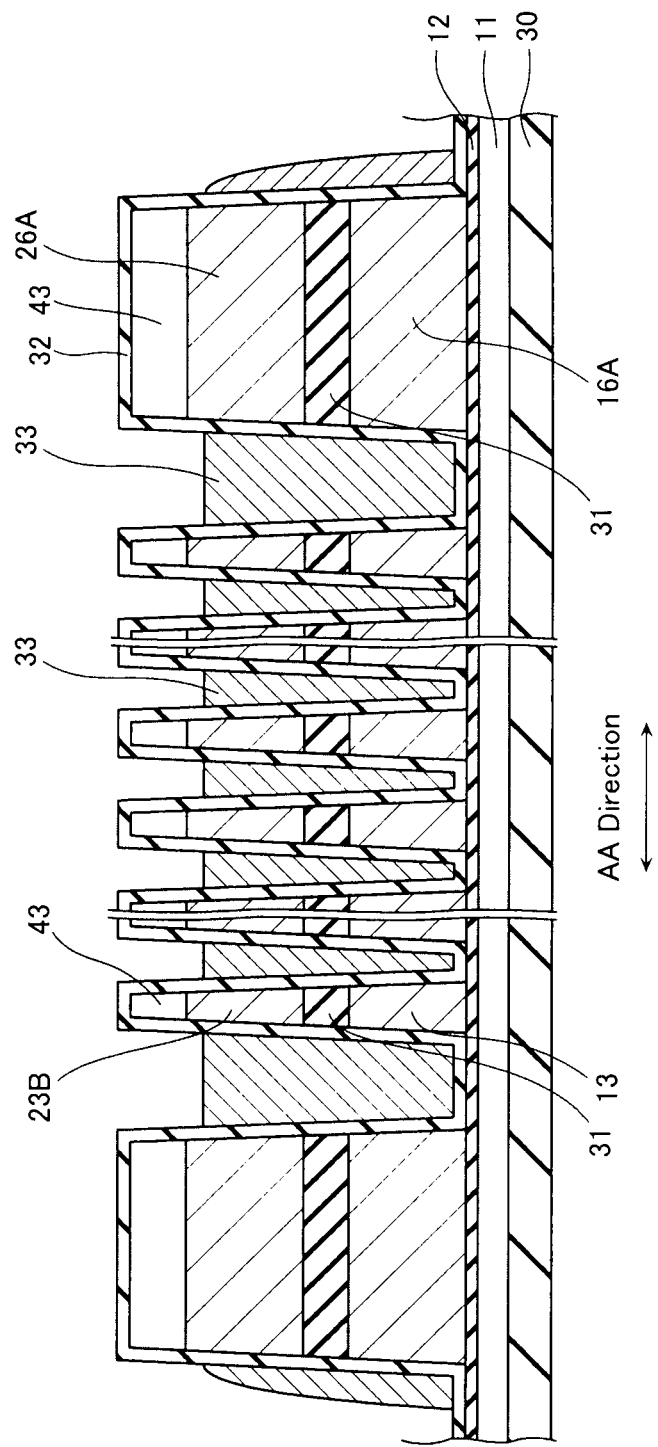
FIG. 12 is a cross-sectional diagram showing a step of manufacturing the memory cell array.
Figure 13:
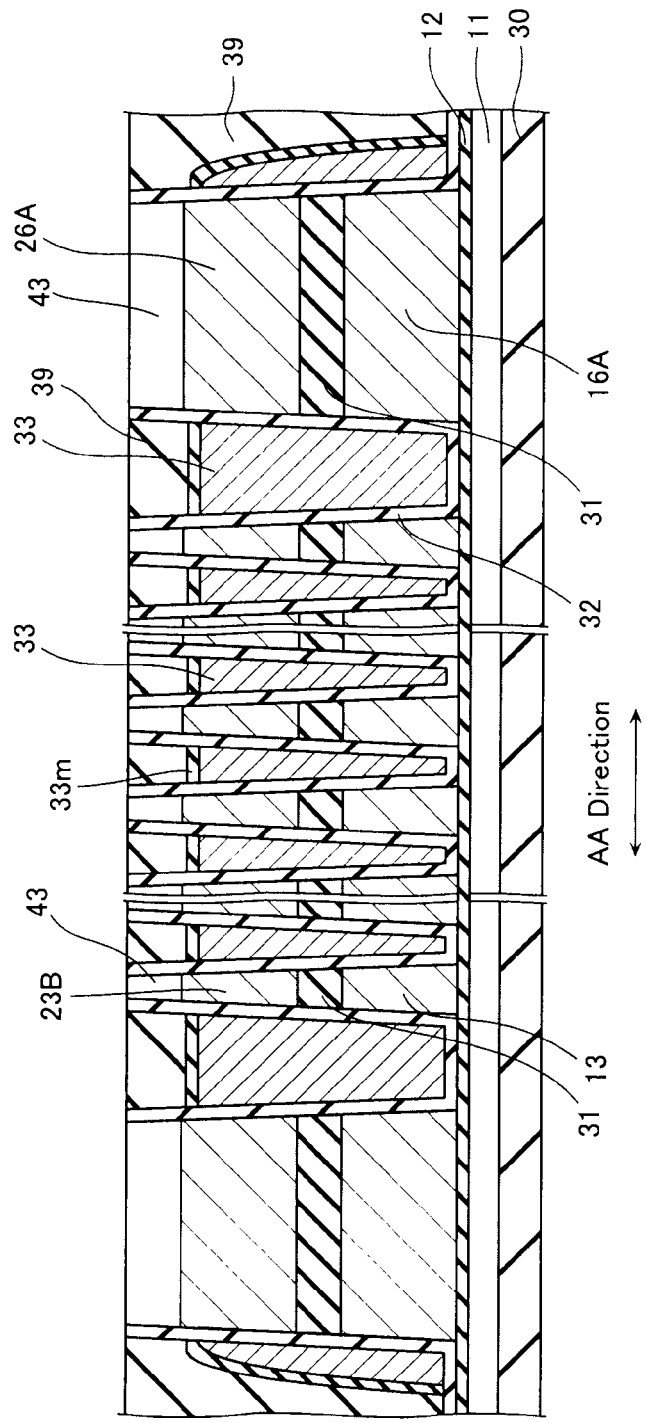
FIG. 13 is a cross-sectional diagram showing a step of manufacturing the memory cell array.
Figure 14:
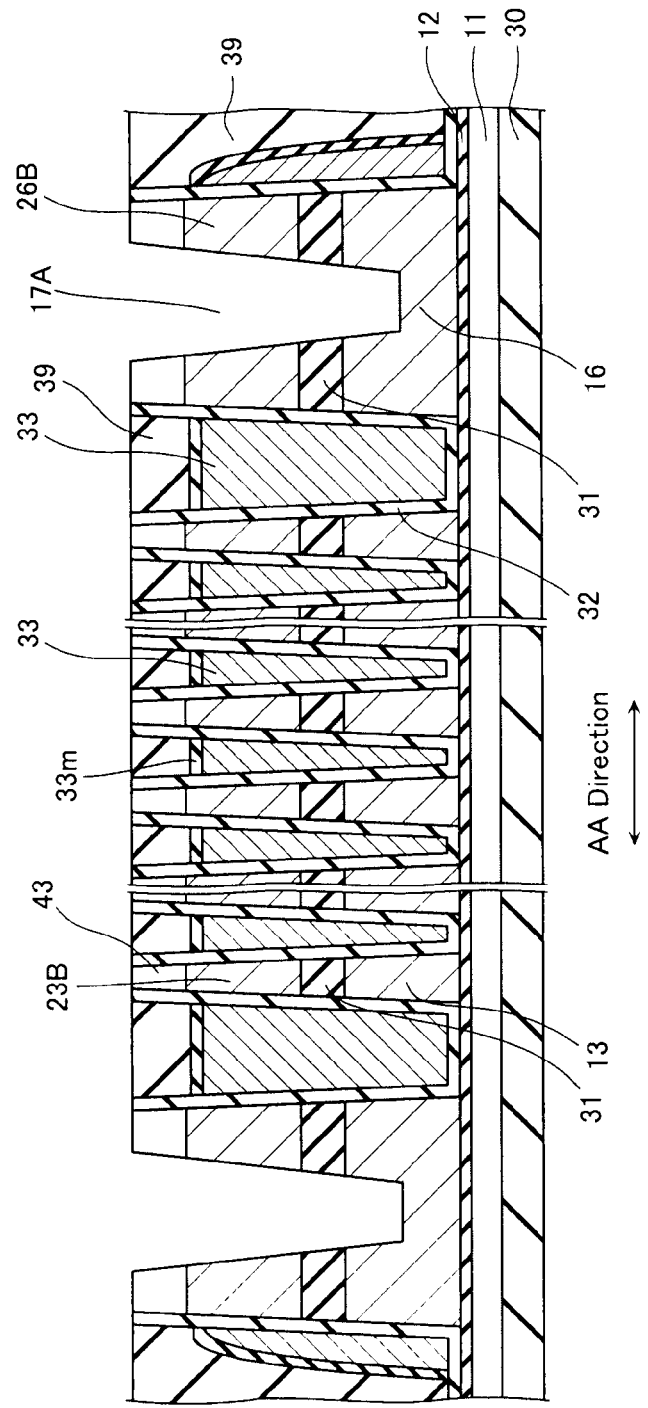
FIG. 14 is a cross-sectional diagram showing a step of manufacturing the memory cell array.

Next, as shown in FIG. 12, the control gate forming layer 33A is etched back by RIE to form control gates 33. Then, as shown in FIG. 13, a mask material 33*m* and an insulating layer 39 made of a CVD oxide film, a coated oxide film, or the like are embedded above the control gates 33, and the uppermost surface is planarized by CMP using the mask 43 made of SiN as a stopper. After this, in order to form the select gate forming layers 16A and 26A and transistors of an unillustrated row decoder region, select gate trenches equivalent to EI (Etching Inter Poly) trenches are formed by RIE or the like. As a result, select gate trenches 17A which reach down to the first select gate 16 through a second select gate forming layer 26B and the first insulating layer 31 are formed as shown in FIG. 14.

Figure 15:
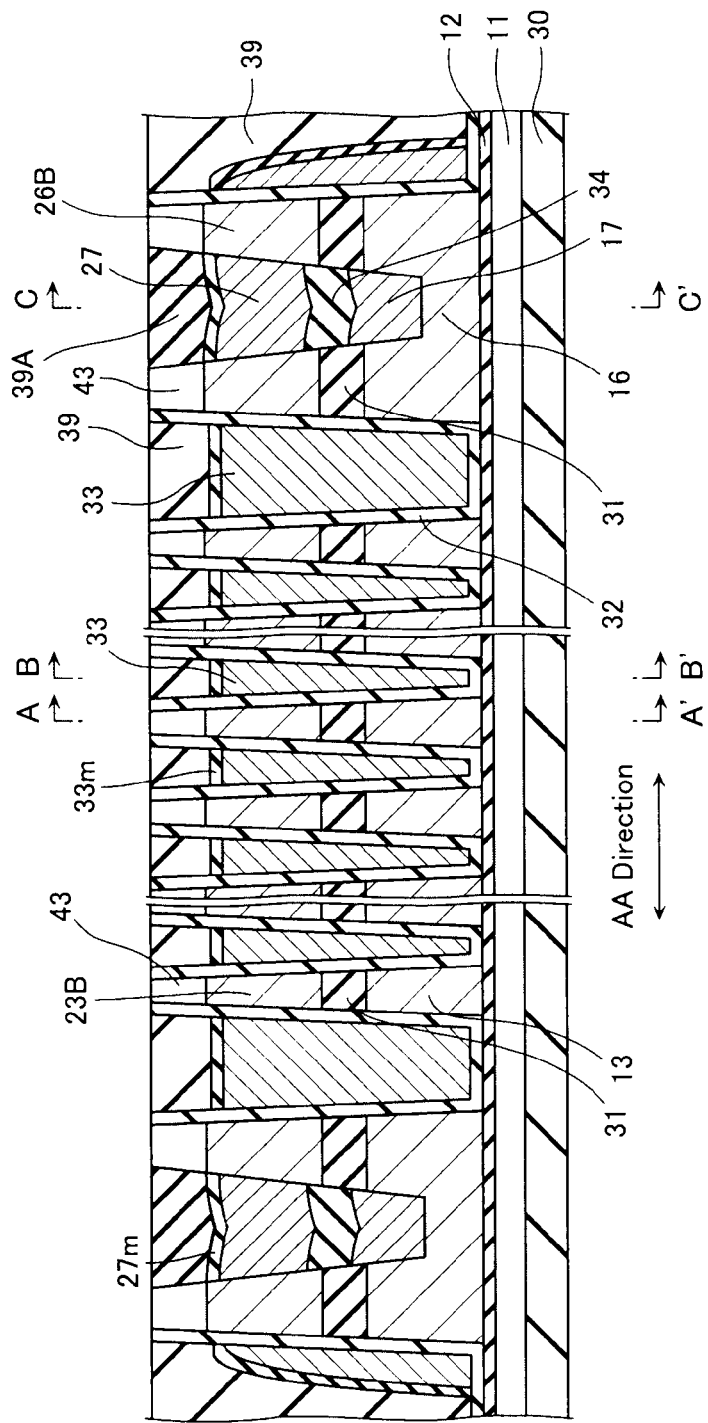
FIG. 15 is a cross-sectional diagram showing a step of manufacturing the memory cell array.
Figure 16:
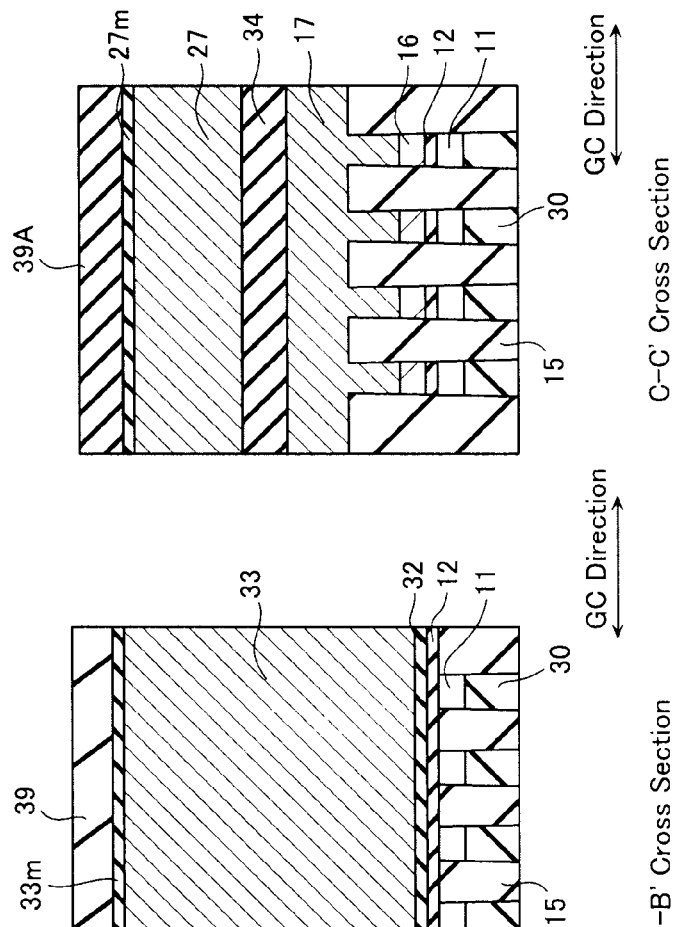
FIG. 16A, 16B, and 16C are cross sectional diagrams of FIG. 15 taken along lines A-A', B-B', and C-C', respectively.

Next, as shown in FIG. 15, in order to form select gate transistors S11 to S22 independently for lower cells and upper cells, a first select gate line 17, a second insulating layer 34, and a second select gate line 27 are sequentially formed in the select gate trenches 17A by repeating embedding and etch back. The select gate lines 17 and 27 may be made of polysilicon or metal (W, etc.) like the control gate 33. A cap insulating film 39A is embedded in the etched-back portion of the second select gate line 27, and the upper surface of the cap insulating film 39A is planarized by CMP using the mask material 43 as a stopper. FIGS. 16A, 16B, and 16C are an A-A' cross section, a B-B' cross section, and a C-C' cross section of FIG. 15 respectively.

Figure 17:
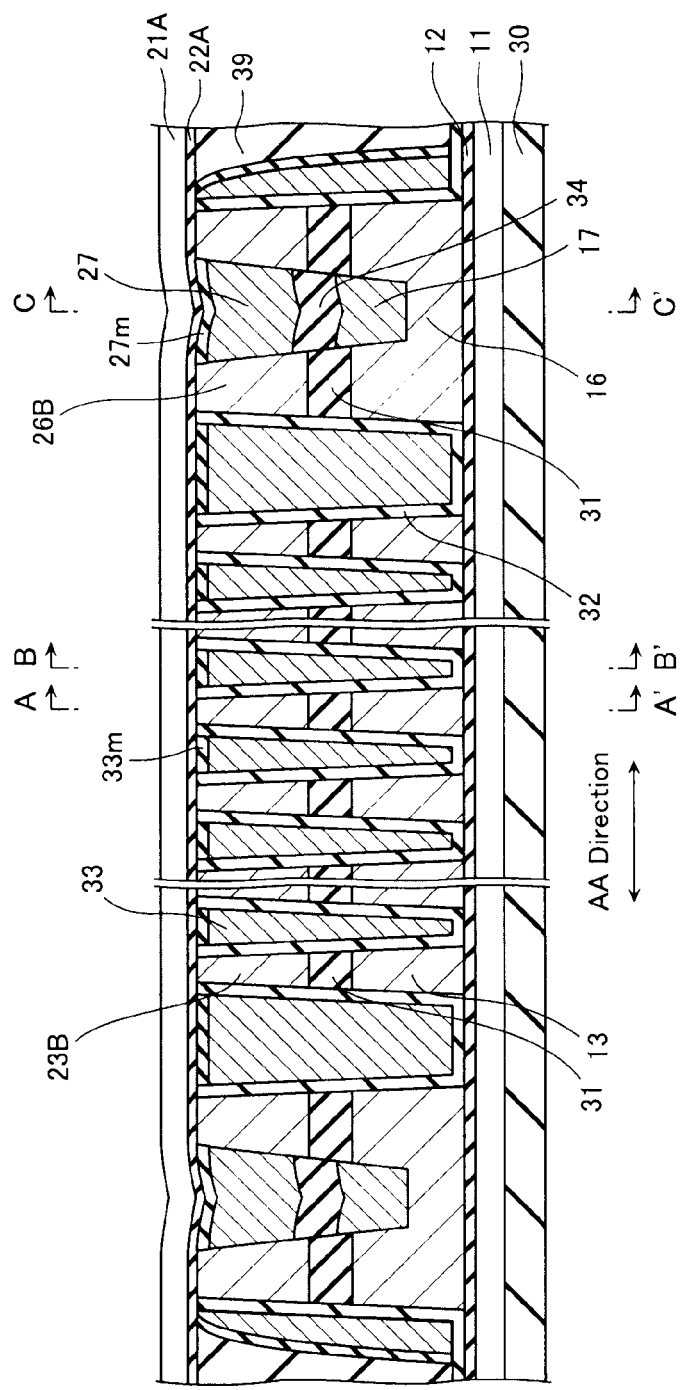
FIG. 17 is a cross-sectional diagram showing a step of manufacturing the memory cell array.
Figure 18A:
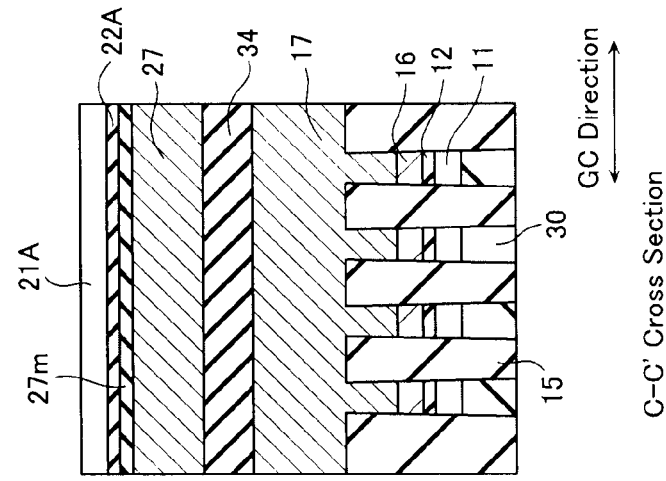
FIG. 18A, 18B, and 18C are cross sectional diagrams of FIG. 17 taken along lines A-A', B-B', and C-C', respectively.
Figure 18B:
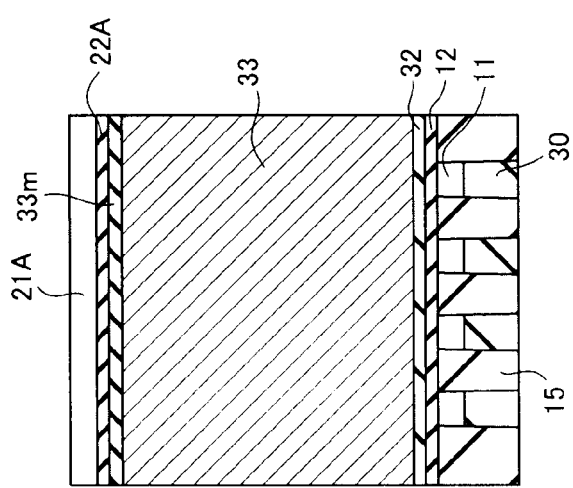
Figure 18C:
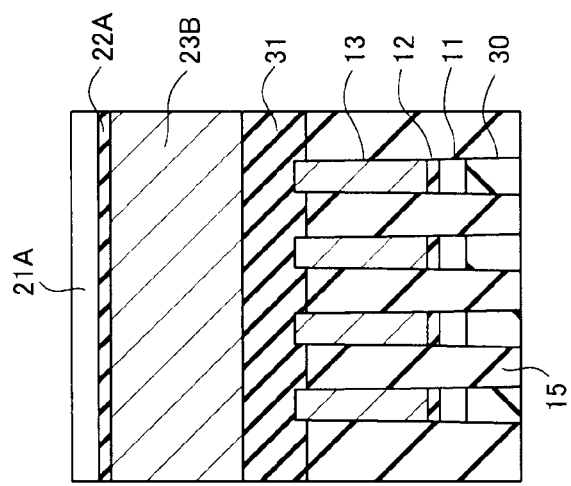

Next, as shown in FIG. 17, planarization is carried out by CMP using the second floating gate forming layer 23B or the control gate 33 as the stopper, and a second tunnel insulating film (gate insulating film) 22A made of SiO$_2$ and a second semiconductor layer 21A made of polysilicon are sequentially formed above the planarized surface. FIGS. 18A, 18B, and 18C are an A-A' cross section, a B-B' cross section, and a C-C' cross section of FIG. 17 respectively.

Figure 19:
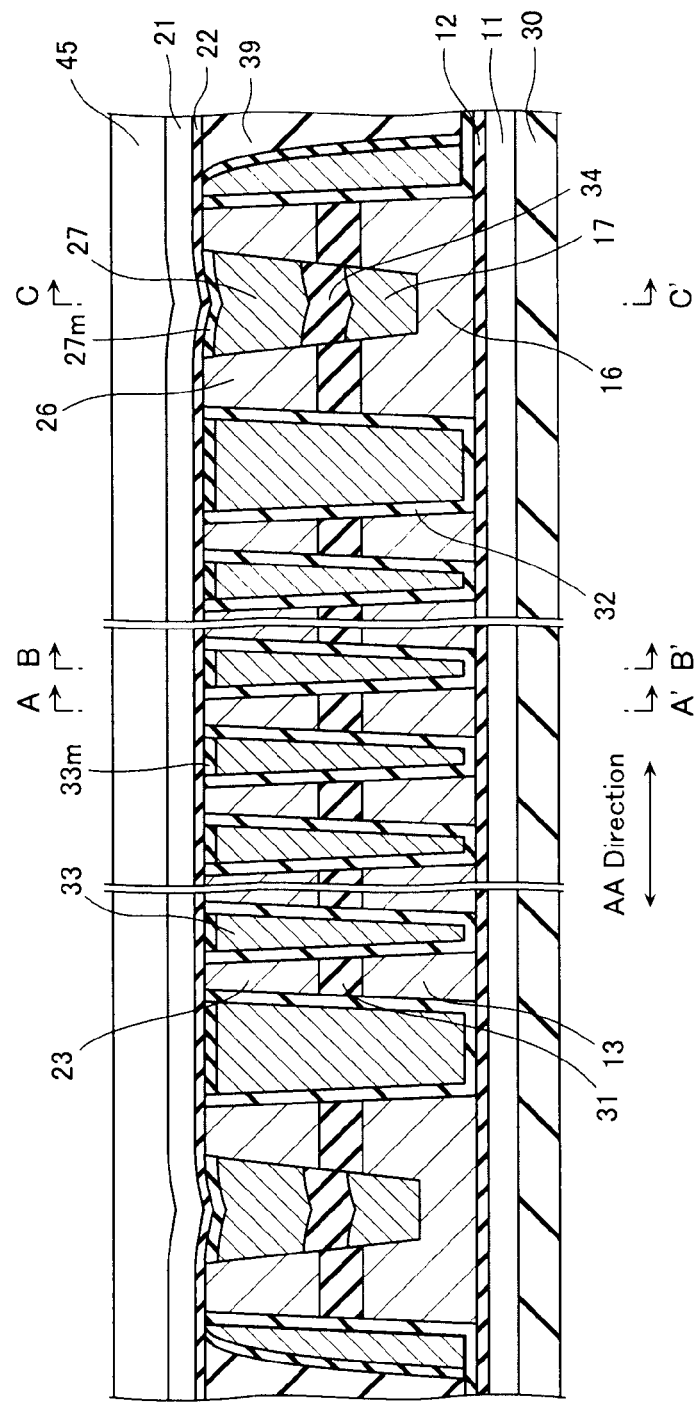
FIG. 19 is a cross-sectional diagram showing a step of manufacturing the memory cell array.
Figure 20C:
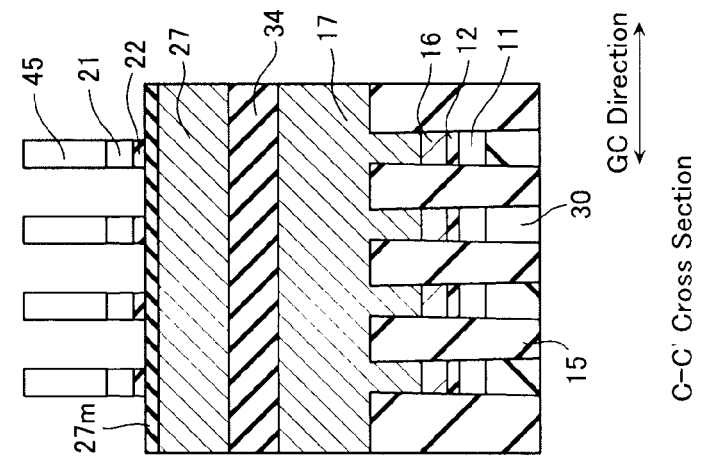
FIG. 20A, 20B, and 20C are cross sectional diagrams of FIG. 19 taken along lines A-A', B-B', and C-C', respectively.
Figure 20B:
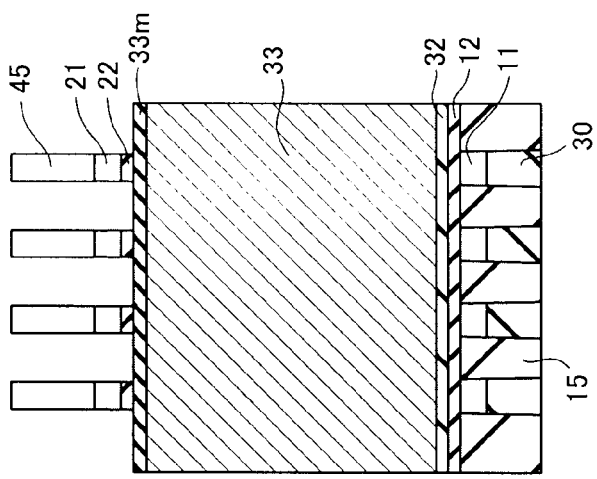
Figure 20A:
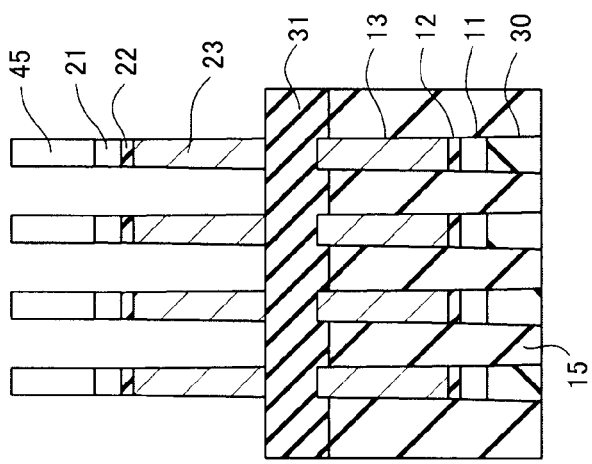

Then, as shown in FIG. 19, in order to form AA pattern into the second semiconductor layer 21A, the second tunnel insulating film 22A, the second floating gate forming layer 23B, and the second select gate forming layer 26B of the upper layer, a mask material 45 for AA pattern formation made of SiN is patterned onto the second semiconductor layer 21A, and RIE is carried out to form the AA pattern to thereby form third trenches. This AA pattern formation is carried out by an etching process having a high selectivity toward the mask materials 27m and 33m, and the control gate 33 and the select gate line 27 are not etched. FIGS. 20A, 20B, and 20C are an A-A' cross section, a B-B' cross section, and a C-C' cross section of FIG. 19 respectively. Through this step, the second floating gate 23 is formed, and the second tunnel insulating film 22 and the second semiconductor layer 21 are formed self-aligned with the second floating gate 23.

Then, a second element isolating insulating layer 25 (FIG. 3) is embedded in the trenches of the upper layer AA pattern. Finally, through-holes are formed in end portions of the semiconductor layers 11 and 21, control gates 33 and select gate lines 17 and 27 to form contacts 35 to 38 and thereby complete two memory cell array layers 10 and 20. The material of the contacts 35 to 38 may be polysilicon, metal (W, etc.), etc. which are used commonly.

According to this embodiment, since the AA pattern is formed in the lower layer first floating gate 13 and in the upper layer second floating gate 23 at different timings, the first floating gate 13 and the second floating gate 23 might be misaligned in the GC direction. However, this will not hinder the operation because they are different memory cells MC1 and MC2.

In contrast, any misalignment between the first floating gate 13 and the channel of the first semiconductor layer 11 or between the second floating gate 23 and the channel of the second semiconductor layer 21 would greatly influence the operations of the memory cells MC1 or MC2. In this regard, according to the memory cell array structure of the present embodiment, the first semiconductor layer 11, the first tunnel insulating film 12, and the first floating gate 13 of the lower layer are simultaneously subjected to AA pattern formation, and the second semiconductor layer 21, the second tunnel insulating film 22, and the second floating gate 23 of the upper layer are simultaneously subjected to AA pattern formation. Hence, it is possible to prevent misalignment between the memory cells MC1 or MC2 and the channel of the semiconductor layer 11 or 21 in each layer. Therefore, the memory cells MC1 and MC2 can operate without fault.

Furthermore, according to the present embodiment, it is possible to shorten the manufacturing process because the control gates 33 are shared between the lower and upper memory cells MC1 and MC2, and the upper layer and the lower layer are simultaneously subjected to GC pattern formation.

Second Embodiment

[Memory Cell Array Structure According to Second Embodiment]

Figure 21:
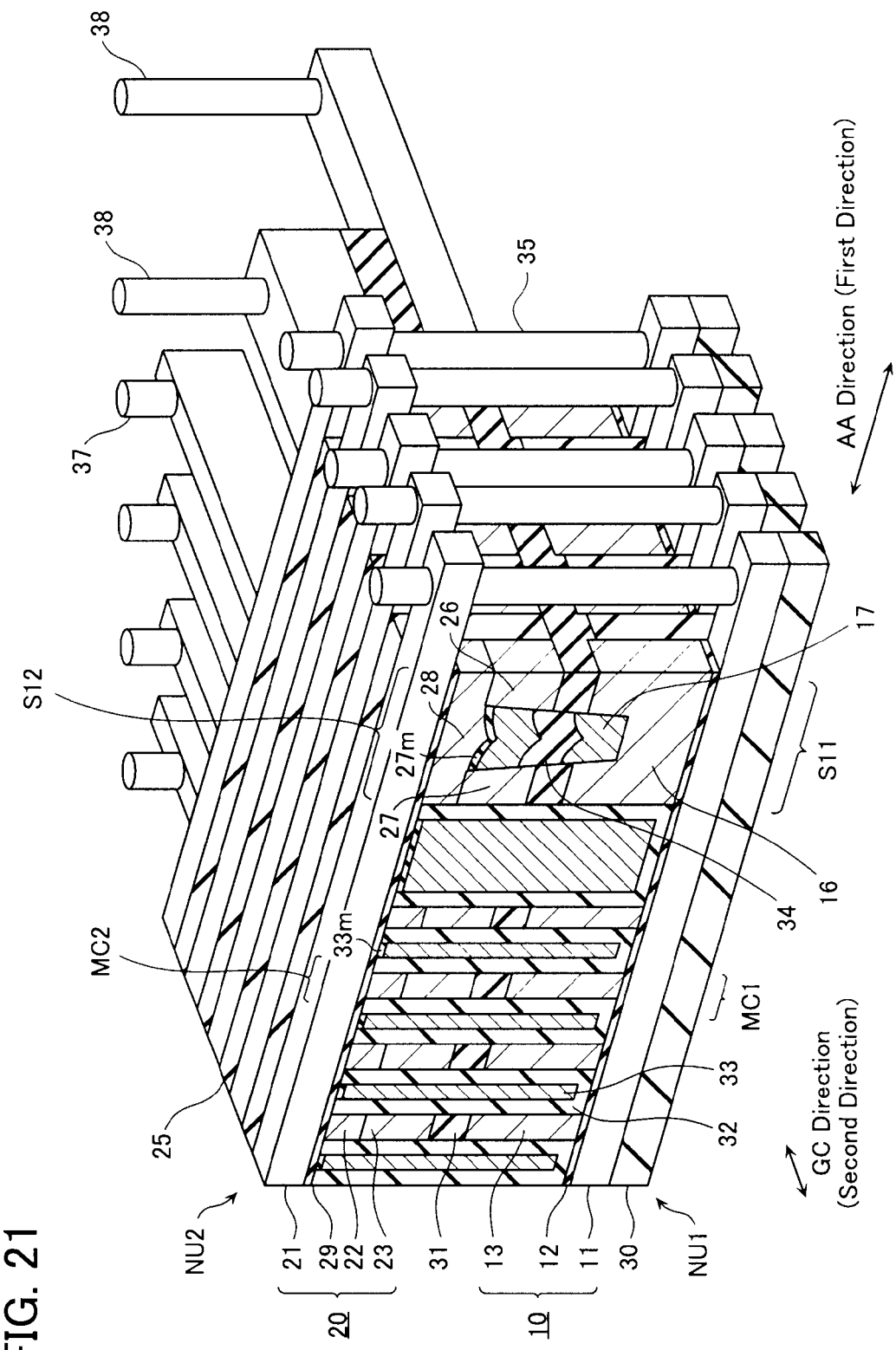
FIG. 21 is a perspective diagram showing a memory cell array structure of a nonvolatile semiconductor memory device according to a second embodiment.
Figure 22:
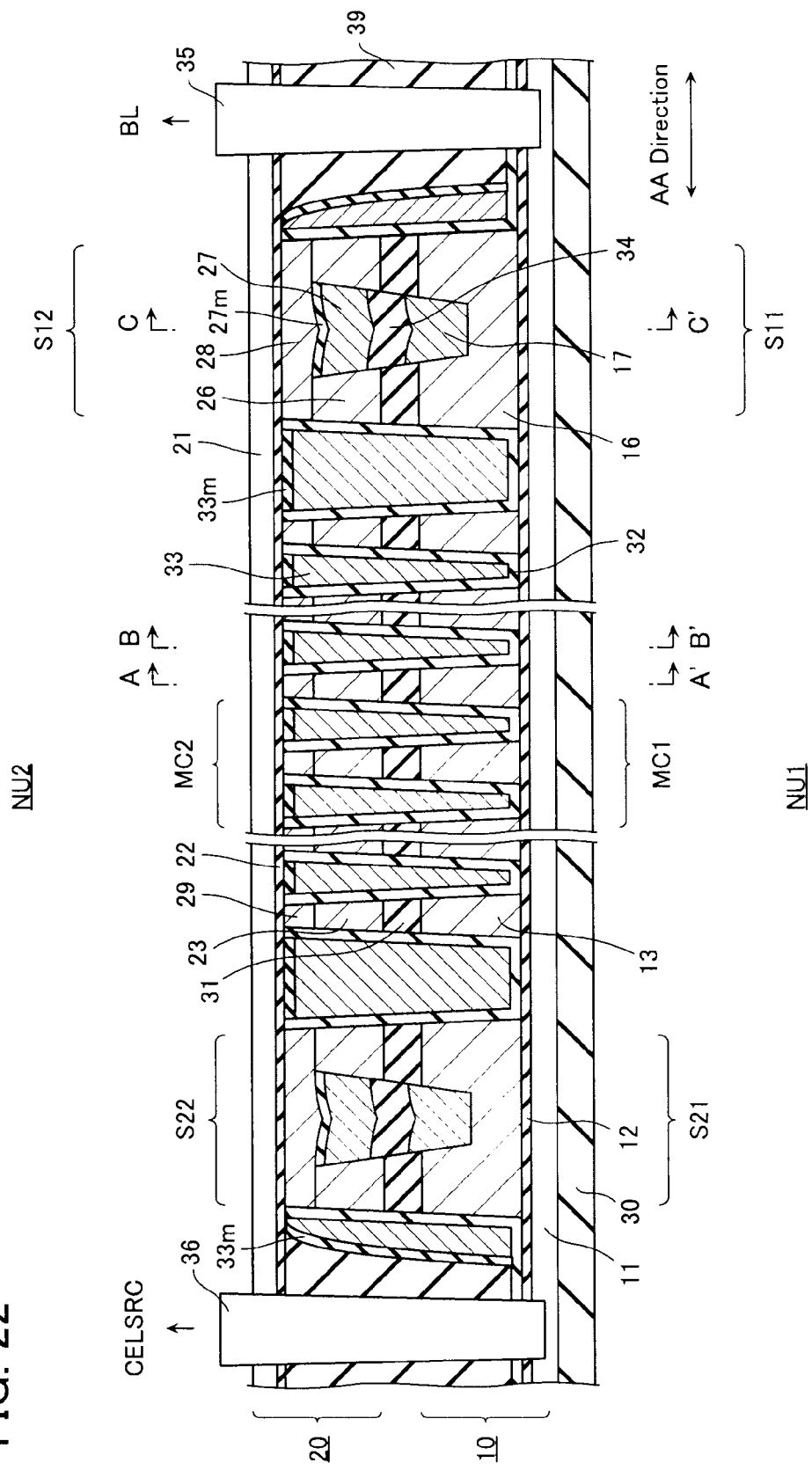
FIG. 22 is a cross-sectional diagram showing the memory cell array seen from a GC direction.
Figures 23A, 23B, 23C:
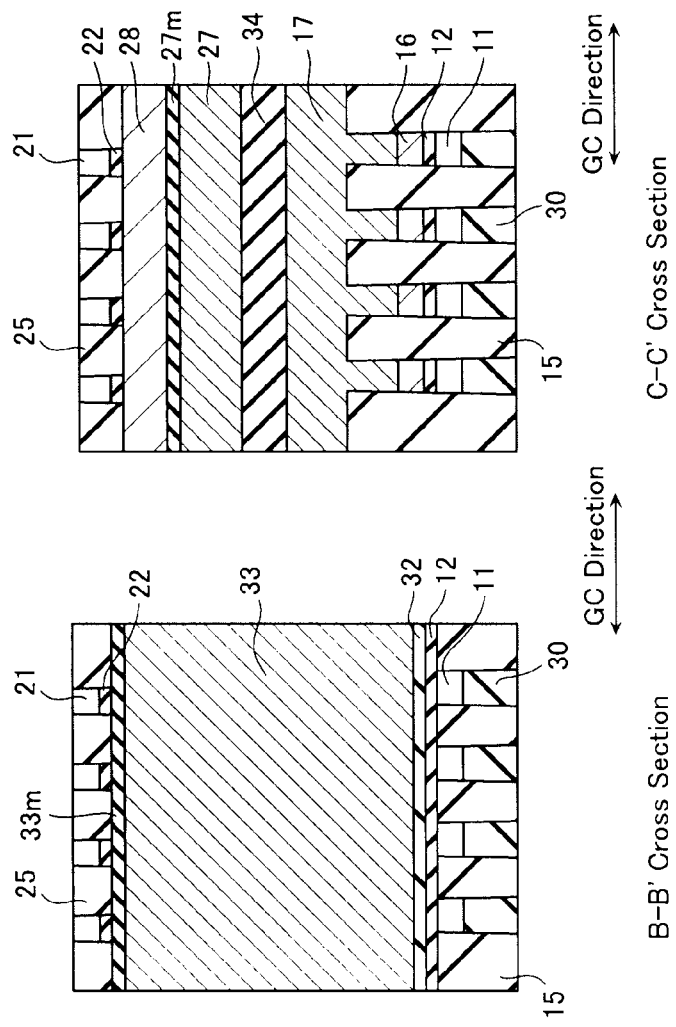
FIGS. 23A, 23B, and 23C are cross-sectional diagrams of FIG. 22 taken along lines A-A', B-B', and C-C', respectively.

Next, a memory cell array structure according to the second embodiment will be explained. FIG. 21 is a perspective diagram of the memory cell array structure according to the second embodiment. FIG. 22 is a cross-sectional diagram of FIG. 21 seen from the GC direction. FIG. 23 are cross-sectional diagrams of FIG. 22 taken along lines A-A', B-B', and C-C' and seen from the AA direction of FIG. 21.

The present embodiment is different from the first embodiment in that it comprises two-layered second floating gates 23 and 29 made of polysilicon as the upper layer floating gate (charge accumulation layer), and two-layered second select gates 26 and 28 made of polysilicon as the upper layer second select gate.

In the first embodiment, the upper surface of the second select gate line directly contacts the second tunnel insulating film 22. Hence, a flat interface is hardly formed between the second select gate line 27 and the second tunnel insulating film 22, and there might be produced dispersion between the characteristic of the lower select gate transistor S11 or S21 and that of the upper select gate transistor S12 or S22.

According to the present embodiment, since the second select gate 28 made of polysilicon is interposed between the second select gate line 27 and the second tunnel insulating film 22, it becomes easier to maintain the second tunnel insulating film 22 flat and to reduce dispersion between the characteristic of the lower select gate transistor S11 or S21 and that of the upper select gate transistor S12 or S22.

[Method for Manufacturing Memory Cell Array Structure according to Second Embodiment]

Next, a method for manufacturing the memory cell array structure according to the present embodiment will be explained.

FIG. 24 to FIG. 41 are diagrams showing the method for manufacturing the memory cell array according to the present embodiment. The process of the present method up to the AA pattern formation is substantially the same as the steps of FIG. 5 to FIG. 7 of the first embodiment. Hence, a detailed explanation will not be given about this process. The present embodiment is different from the first embodiment in that the select gate lines 17 and 27 of the select gate transistors S11 to S12 are formed before GG pattern formation.

Figure 24:
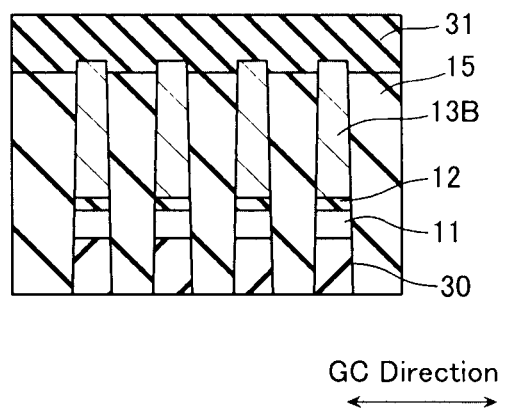
FIG. 24 is a cross-sectional diagram showing a step of manufacturing the memory cell array.
Figure 25:
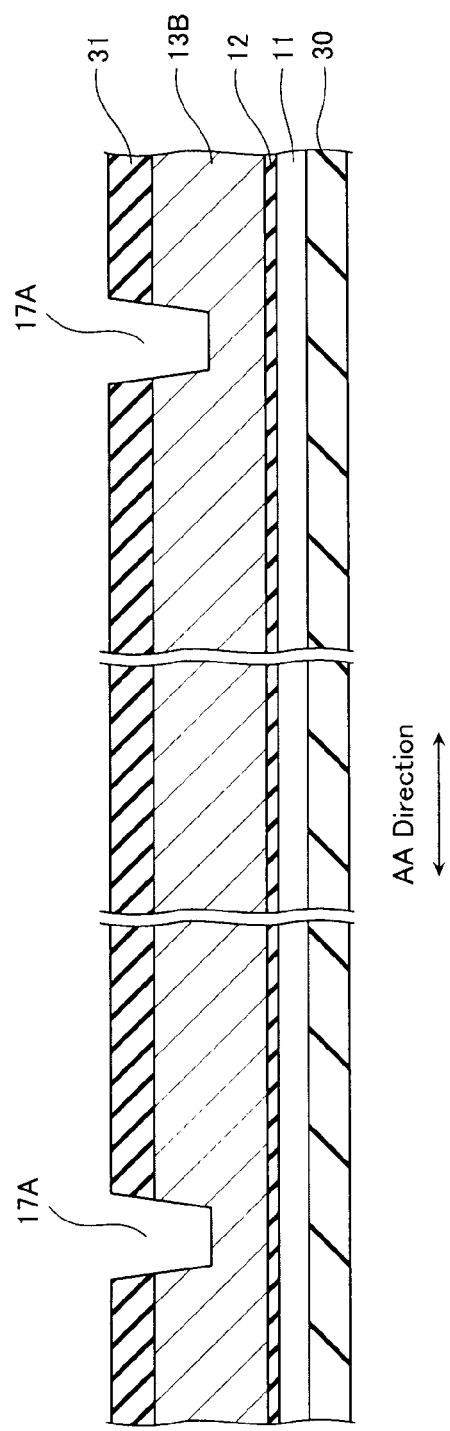
FIG. 25 is a cross-sectional diagram showing a step of manufacturing the memory cell array.

Namely, once the process up to the AA pattern formation into the lower layer has been completed and the AA pattern trenches have been filled with the first element isolating insulating layer 15, a first insulating layer 31 is formed as shown in FIG. 24, and RIE or the like is carried out to form trenches (EI trenches) at positions at which the select gate transistors S11 to S22 having a stacked structure are to be formed, to thereby form first select gate trenches 17A as shown in FIG. 25.

Figure 26:
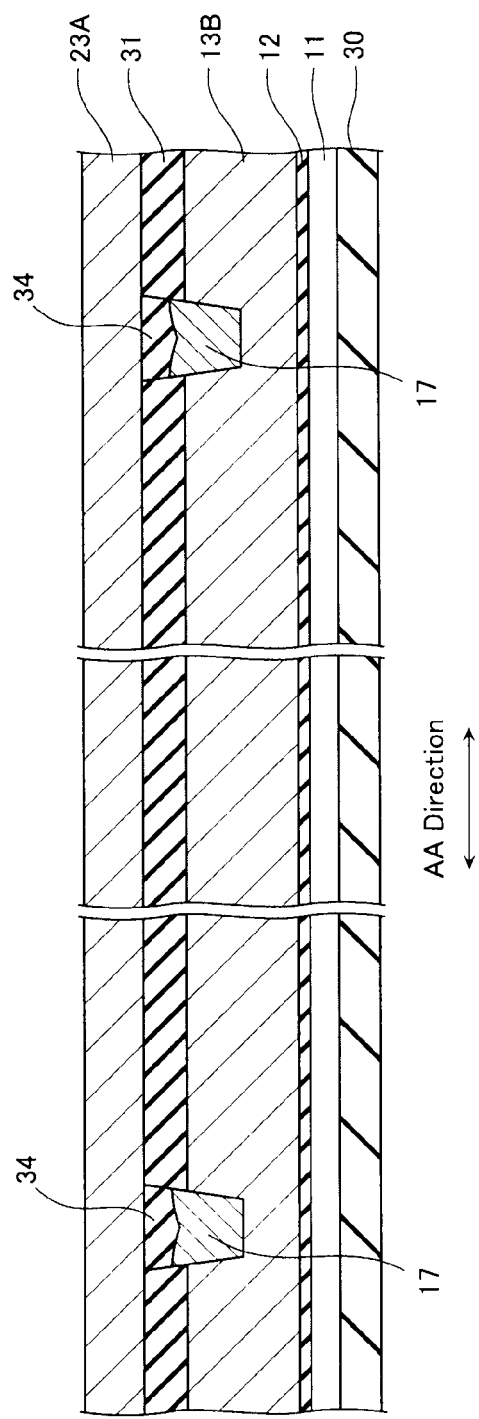
FIG. 26 is a cross-sectional diagram showing a step of manufacturing the memory cell array.

Next, a conductor made of polysilicon or metal (W, etc.) to serve as first select gate lines 17 is embedded in the first select gate trenches 17A and etched back to a position roughly corresponding to the lower surface of the first insulating layer 31, and as shown in FIG. 26, a second insulating layer 34 made of SiO$_2$ is formed above the etched-back surface of the first select gate lines 17, and a second floating gate forming layer 23A made of polysilicon is formed thereabove. Here, the second floating gate forming layer 23A is restricted to approximately 60 to 80% of the objective floating gate thickness, because the floating gate thickness is further increased in a later step.

Figure 27:
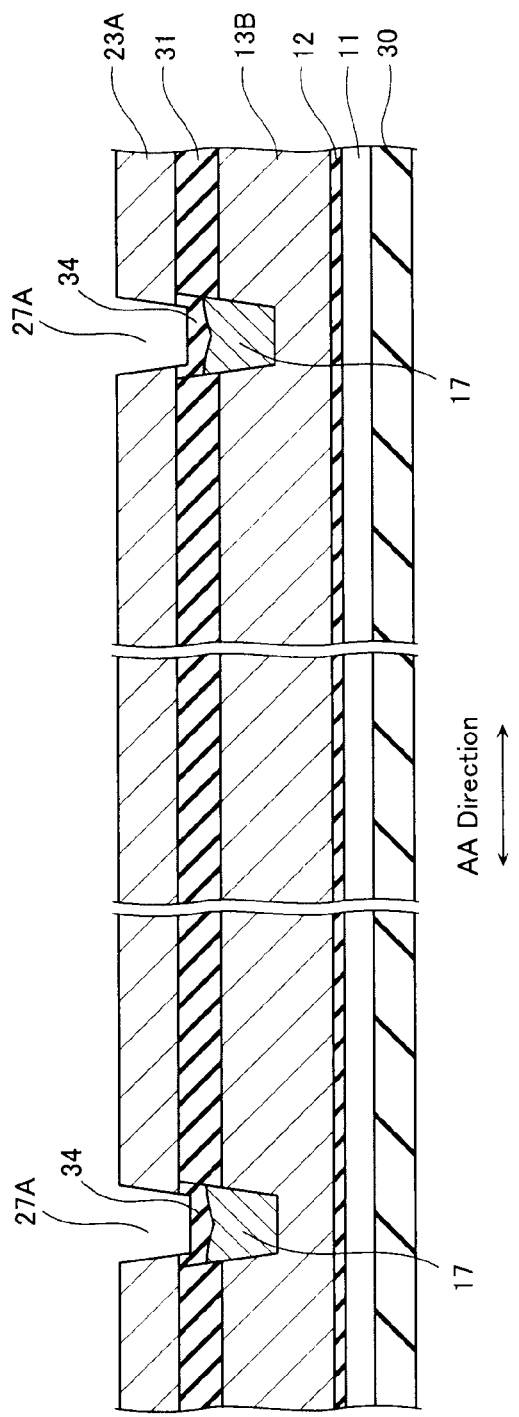
FIG. 27 is a cross-sectional diagram showing a step of manufacturing the memory cell array.

Next, as shown in FIG. 27, RIE or the like is carried out to form trenches (EI trenches) in the second floating gate forming layer 23A above the positions where the first select gate lines 17 are formed, to thereby form second select gate trenches 27A. At this time, it is necessary that the second insulating layer 34 be present between the bottom of the second select gate trenches 27A and the first select gate lines 17.

Figure 28:
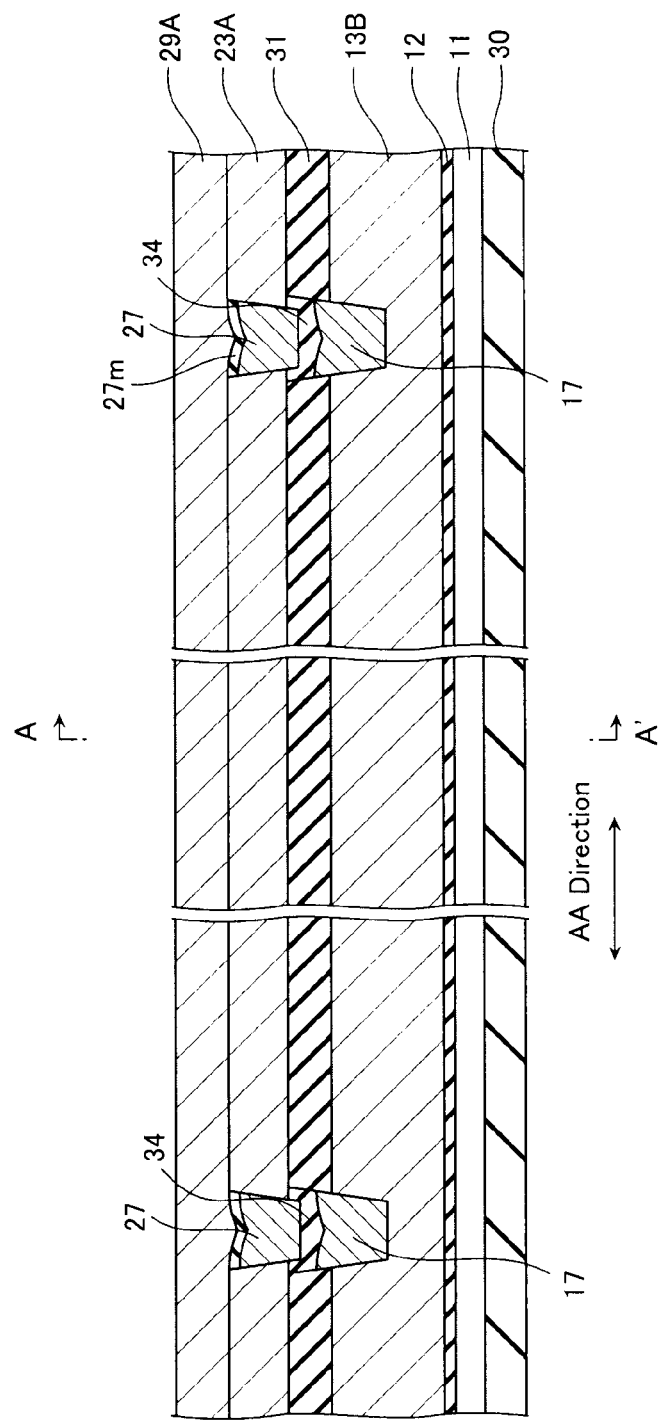
FIG. 28 is a cross-sectional diagram showing a step of manufacturing the memory cell array.
Figure 29:
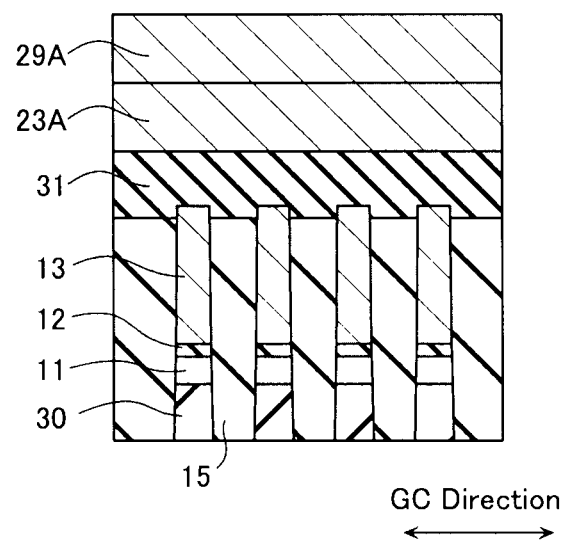
FIG. 29 is a cross-sectional diagram showing a step of manufacturing the memory cell array.

Then, as shown in FIG. 28 and FIG. 29, second select gate lines 27 are embedded in the second select gate trenches 27A and etched back to the top of the floating gate forming layer 23A, and a mask material 27m is formed. A third floating gate forming layer 29A made of polysilicon is formed above the floating gate forming layer 23A. This makes the floating gates of the upper and lower layers substantially the same in thickness.

Figure 30:
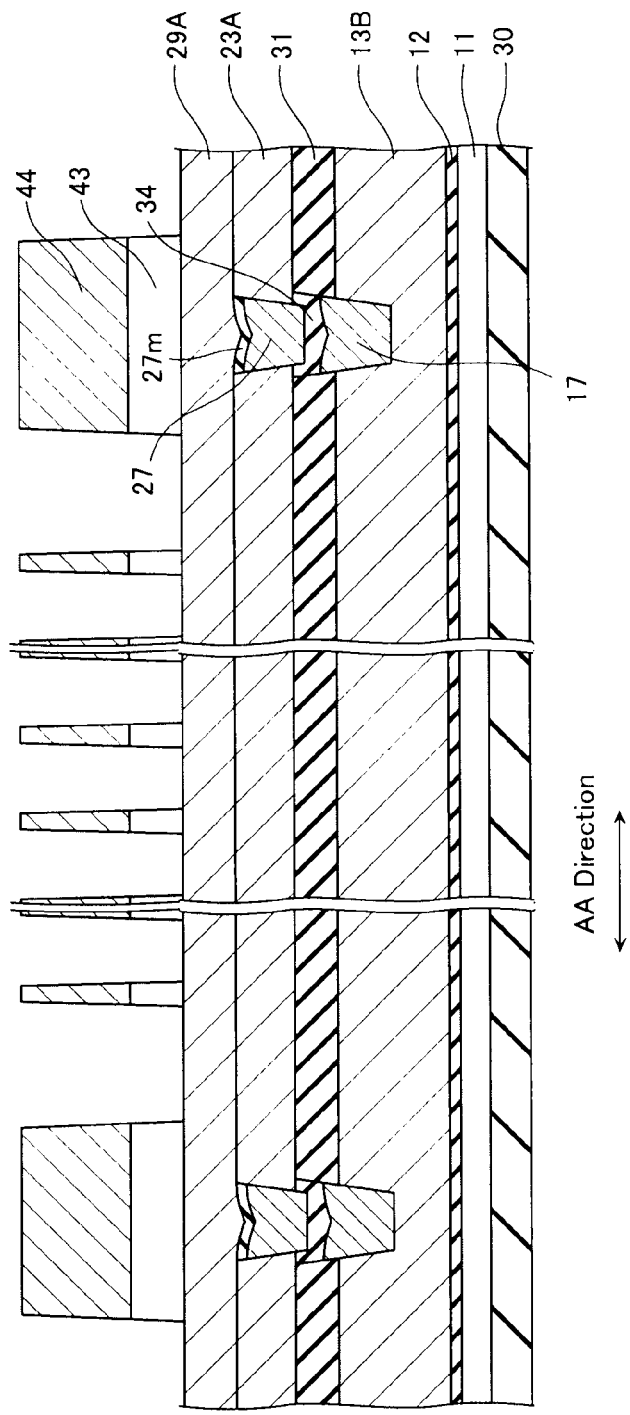
FIG. 30 is a cross-sectional diagram showing a step of manufacturing the memory cell array.
Figure 31:
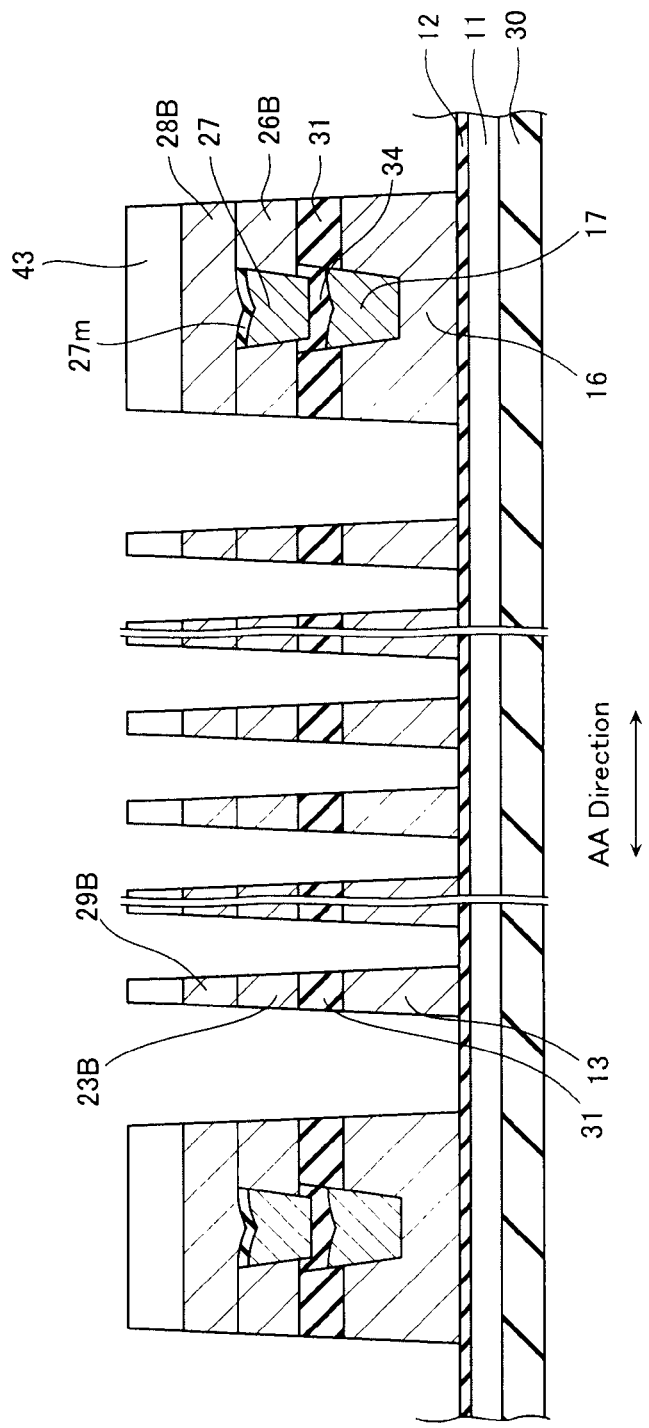
FIG. 31 is a cross-sectional diagram showing a step of manufacturing the memory cell array.

Next, as shown in FIG. 30, mask materials 43 and 44 for GC pattern formation made of SiN and $SiO_2$ are patterned onto the third floating gate forming layer 29A. Then, as shown in FIG. 31, RIE is carried out by using the mask materials 43 and 44 to selectively etch the stack of layers to the top of the first tunnel insulating film 12 to form second trenches to thereby form the GC pattern. As a result, the first floating gate 13, the second floating gate forming layer 23B, the third floating gate forming layer 29B, the first select gate forming layer 16, and second select gate forming layers 26B and 28B are formed. It is preferred that this GC pattern formation be carried out by an etching process having a high selectivity toward the first tunnel insulating film 12 of the lower layer and that the semiconductor layer 11 of the lower layer be not etched.

Figure 32:
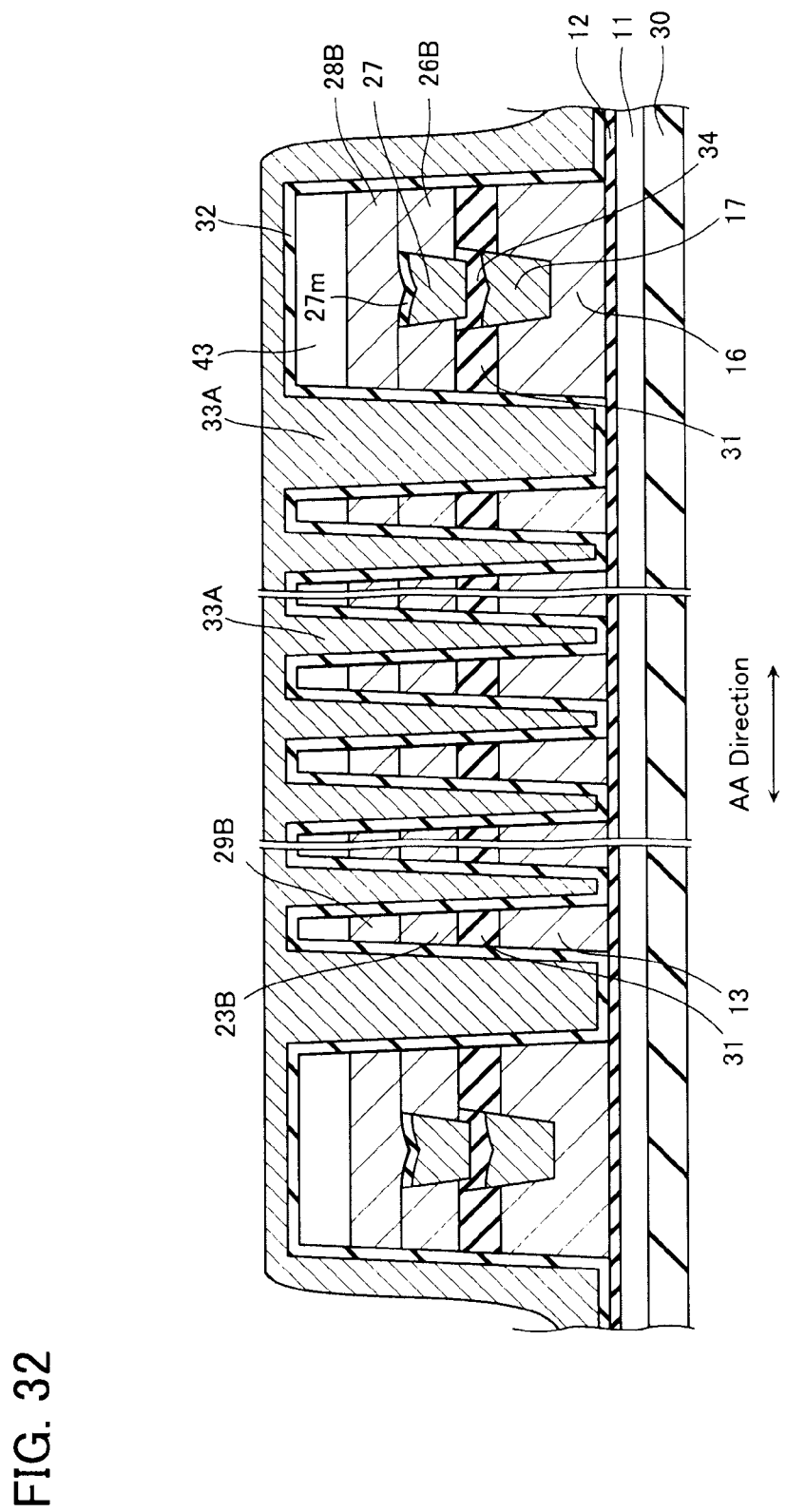
FIG. 32 is a cross-sectional diagram showing a step of manufacturing the memory cell array.

Then, as shown in FIG. 32, after an inter-gate insulating film (IPD) 32 is formed, a control gate forming layer 33A is embedded in the trenches of the GC pattern. Polysilicon or metal (W, etc.) can be used as the control gate forming layer 33A.

Figure 33:
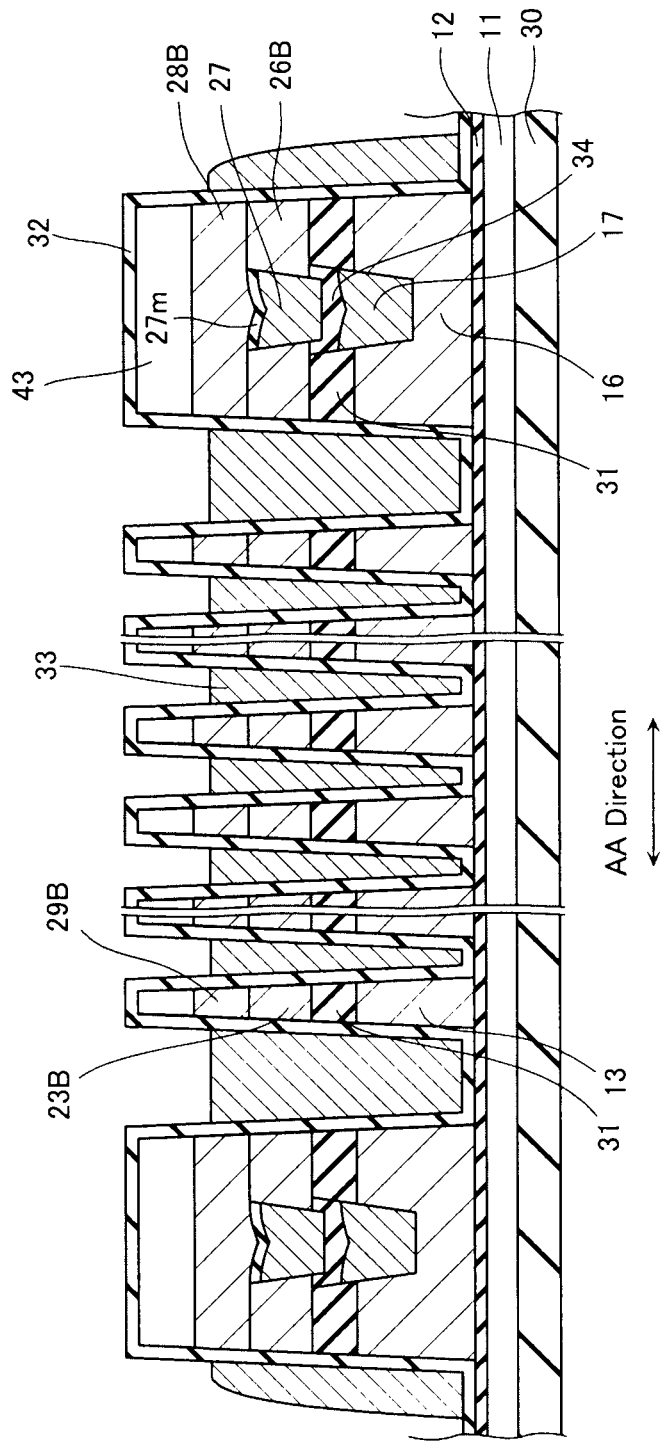
FIG. 33 is a cross-sectional diagram showing a step of manufacturing the memory cell array.
Figure 34:
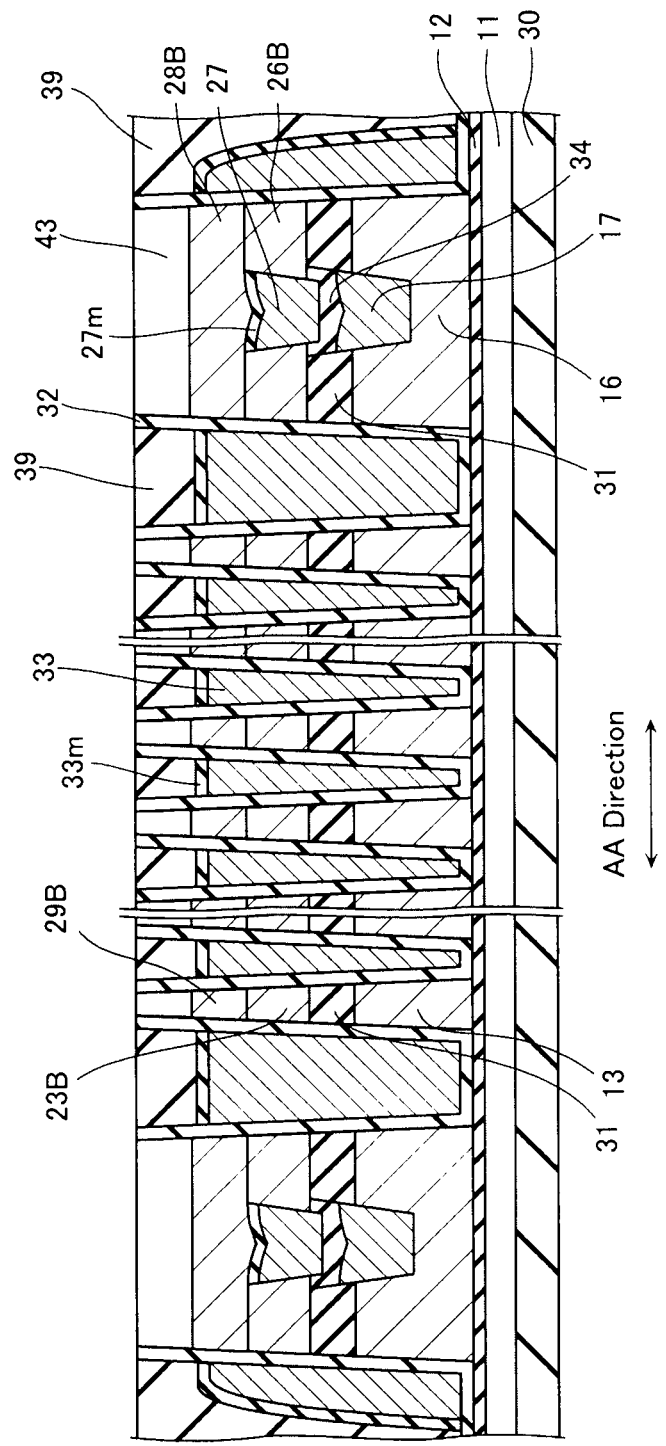
FIG. 34 is a cross-sectional diagram showing a step of manufacturing the memory cell array.
Figure 35:
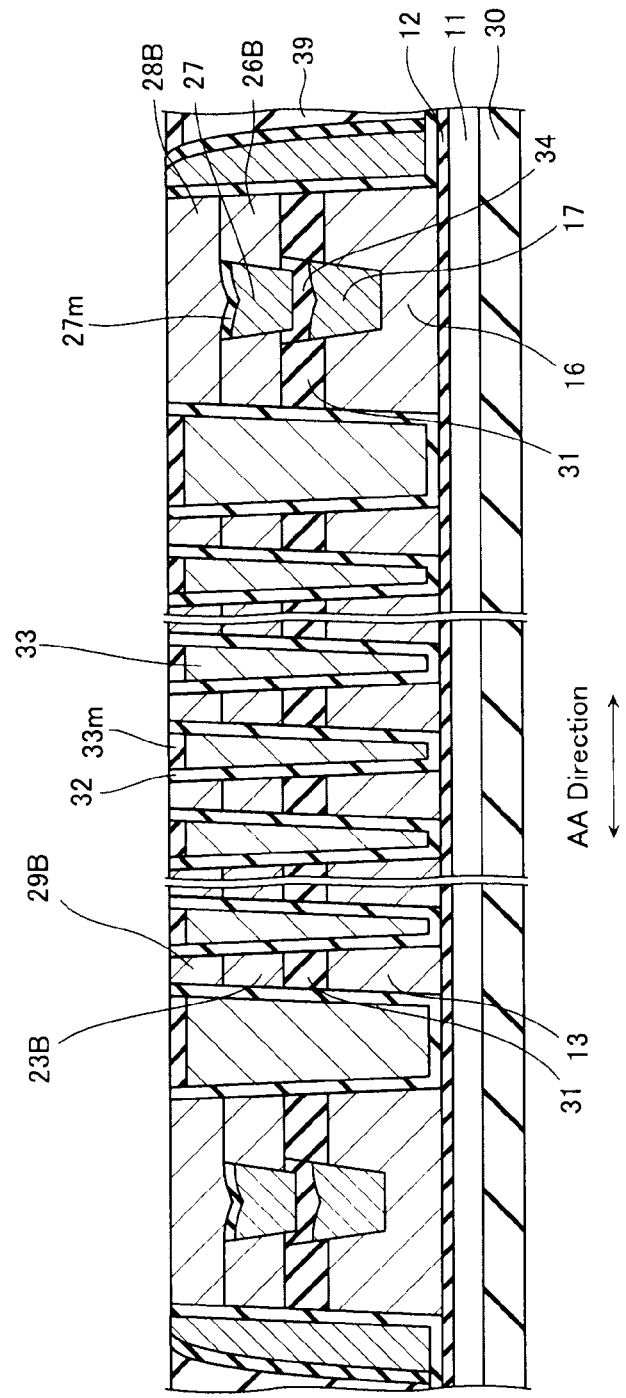
FIG. 35 is a cross-sectional diagram showing a step of manufacturing the memory cell array.
Figure 36:
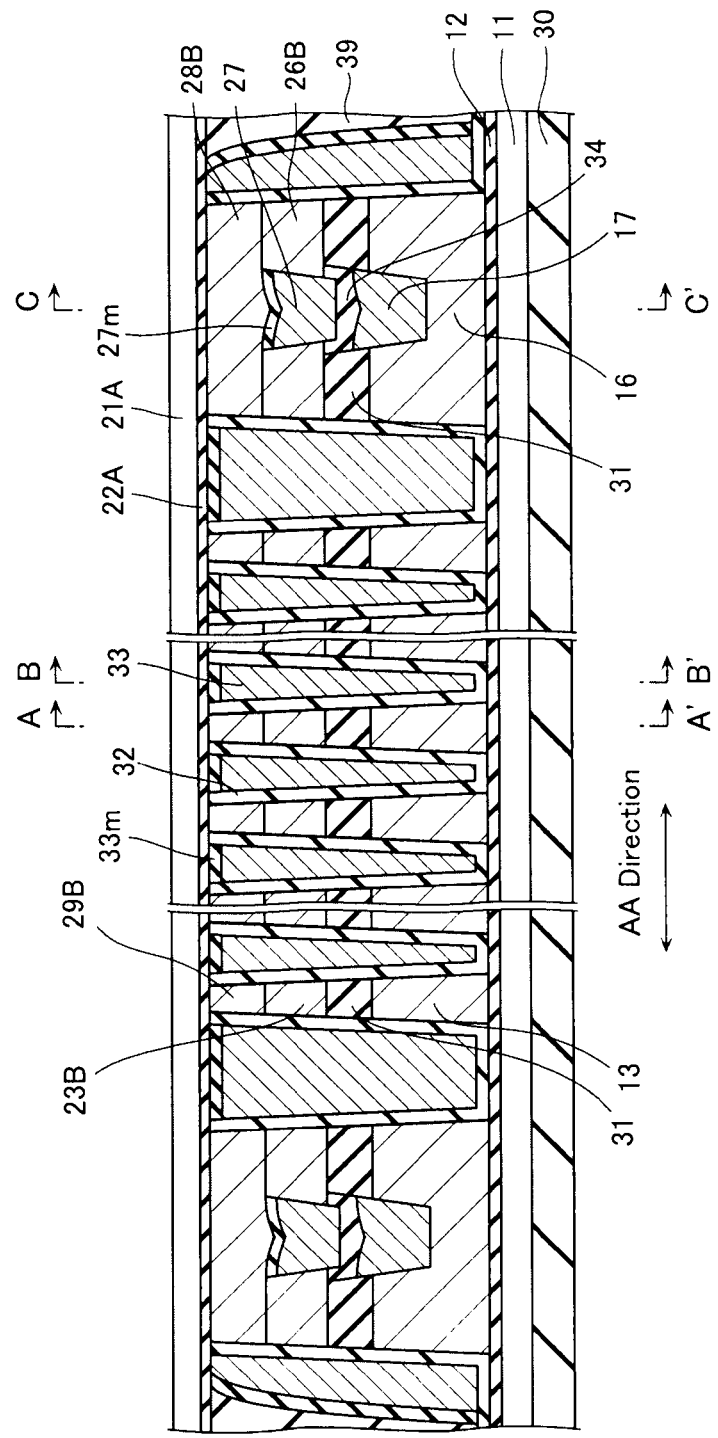
FIG. 36 is a cross-sectional diagram showing a step of manufacturing the memory cell array.
Figures 37A, 37B, 37C:
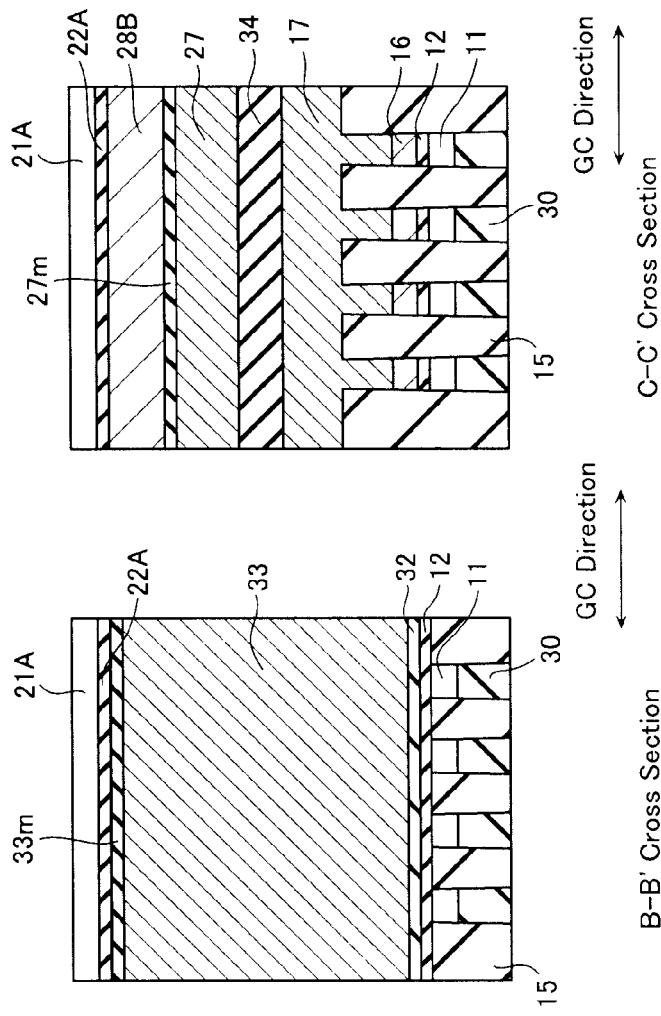
FIG. 37A, 37B, and 37C are cross sectional diagrams of FIG. 36 taken along lines A-A', B-B', and C-C', respectively.

Next, as shown in FIG. 33, the control gate forming layer 33A is etched back by RIE to thereby form the control gate 33. Then, as shown in FIG. 34, a mask material 33m and an insulating layer 39 made of a CVD oxide film, a coated oxide film, or the like are embedded above the control gate 33, and the upper surface is planarized by CMP using the mask 43 made of SiN as the stopper. Then, as shown in FIG. 35, planarization is carried out by CMP using the layers made of polysilicon (the third floating gate forming layer 29B and the second select gate forming layer 28B) as the stopper, and as shown in FIG. 36, a second gate insulating film 22A made of $SiO_2$ and a second semiconductor layer 21A made of polysilicon are sequentially formed above the planarized surface. FIGS. 37A, 37B, and 37C are an A-A' cross section, a B-B' cross section, and a C-C' cross section of FIG. 36 respectively.

Figure 38:
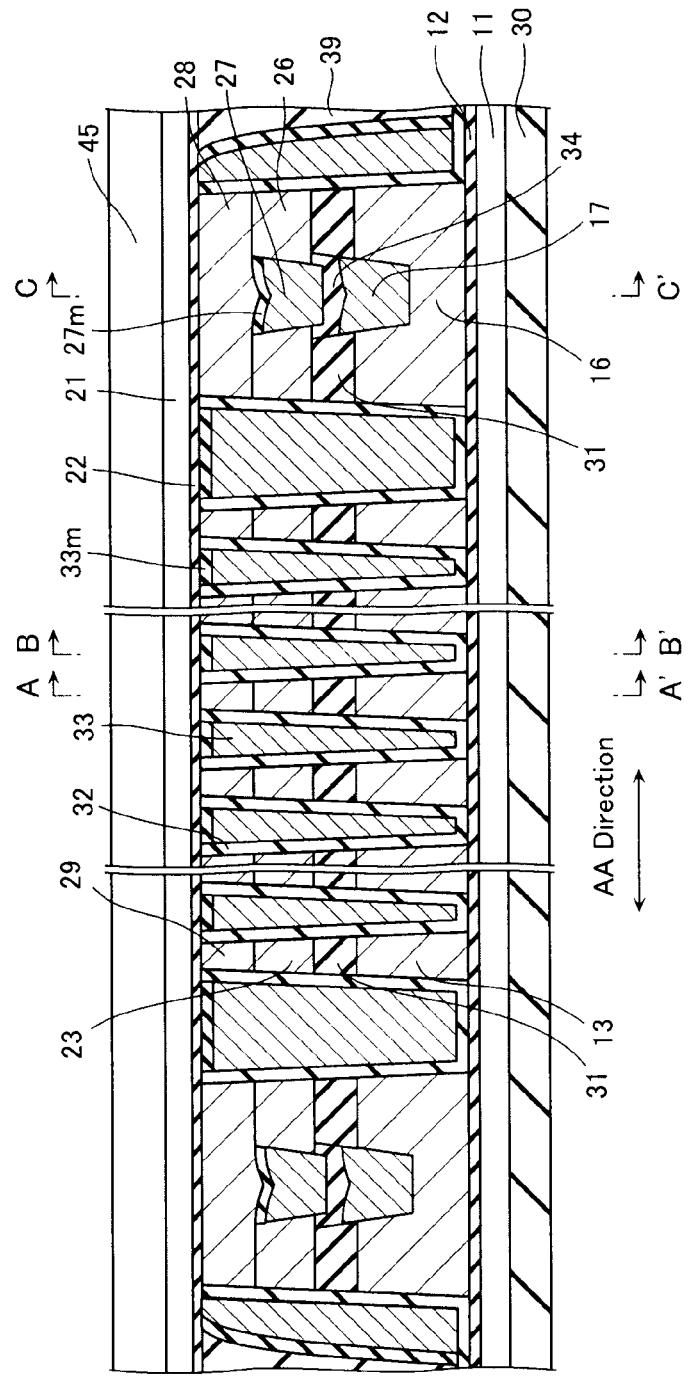
FIG. 38 is a cross-sectional diagram showing a step of manufacturing the memory cell array.
Figures 39A, 39B, 39C:
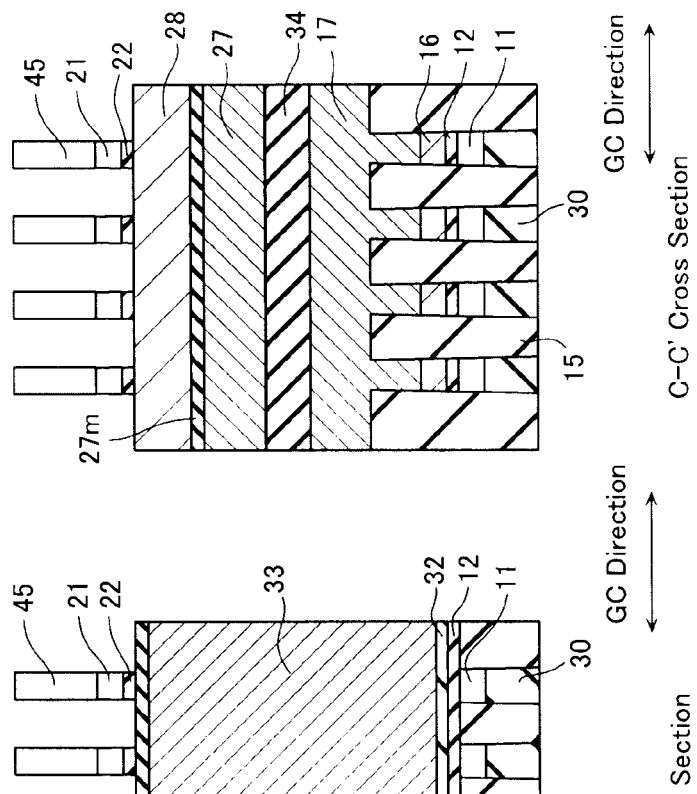
FIG. 39A, 39B, and 39C are cross sectional diagrams of FIG. 38 taken along lines A-A', B-B', and C-C', respectively.

Then, as shown in FIG. 38, in order to form AA pattern into the second semiconductor layer 21A, the second tunnel insulating film 22A, the second floating gate forming layer 23B, the third floating gate forming layer 29B, and the second select gate forming layers 26B and 28B of the upper layer, a mask material 45 for AA pattern formation made of SiN is patterned onto the second semiconductor layer 21A, and RIE is carried out to form the AA pattern to thereby form third trenches. FIGS. 39A, 39B, and 39C are an A-A' cross section, a B-B' cross section, and a C-C' cross section of FIG. 38 respectively. Through this step, the second floating gates 23 and 29 are formed, and at the same time, the second tunnel insulating film 22 and the second semiconductor layer 21 are formed self-aligned with the second floating gates 23 and 29.

Figure 40:
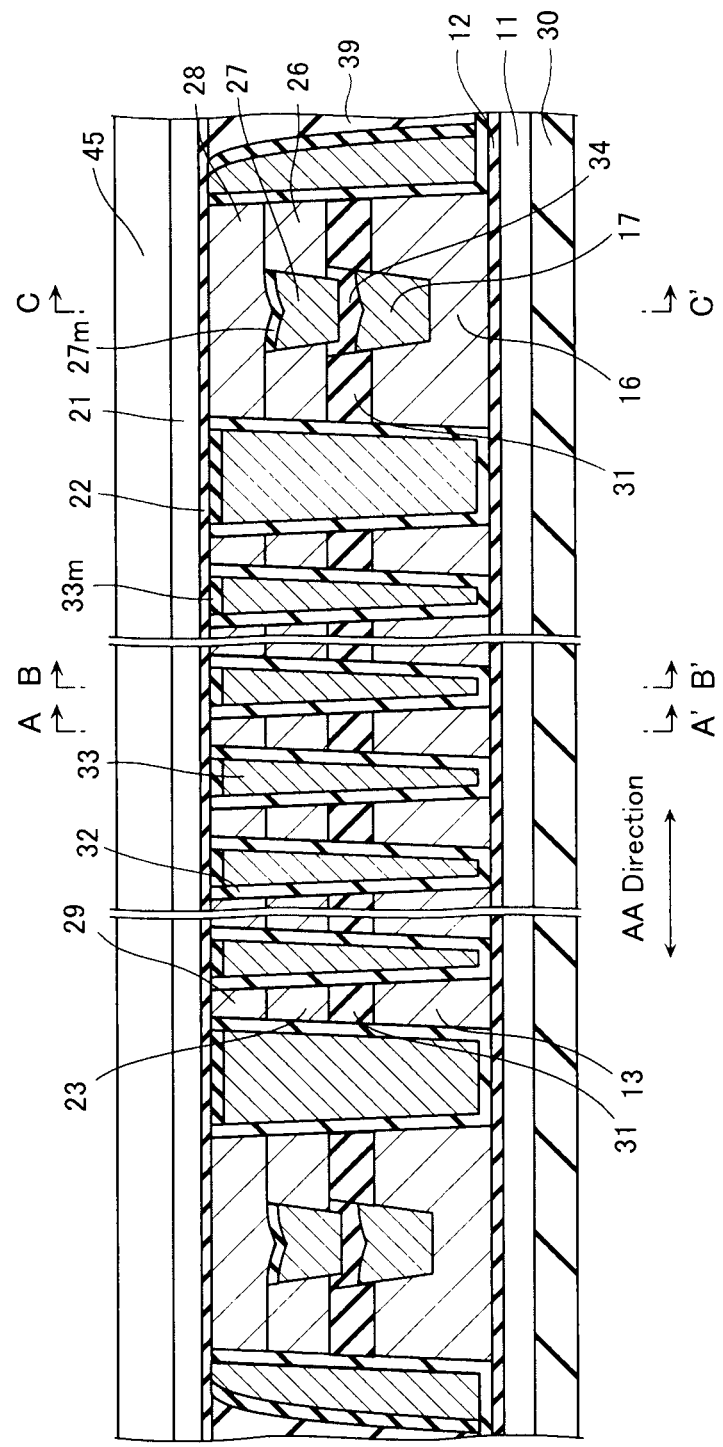
FIG. 40 is a cross-sectional diagram showing a step of manufacturing the memory cell array.
Figure 41C:
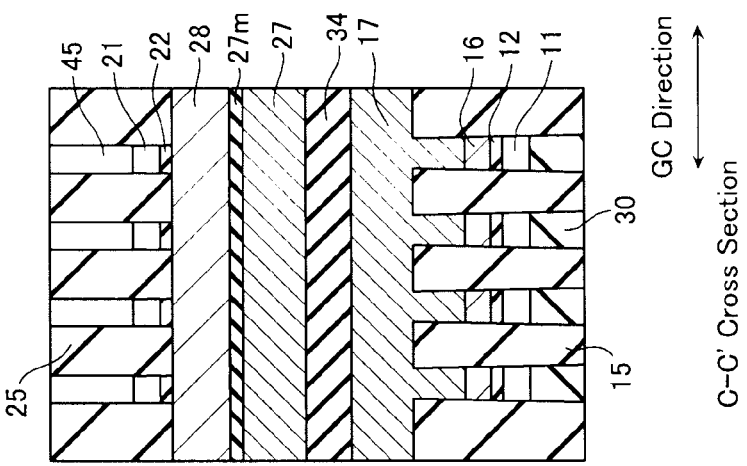
FIG. 41A, 41B, and 41C are cross sectional diagrams of FIG. 40 taken along lines A-A', B-B', and C-C', respectively.
Figure 41B:
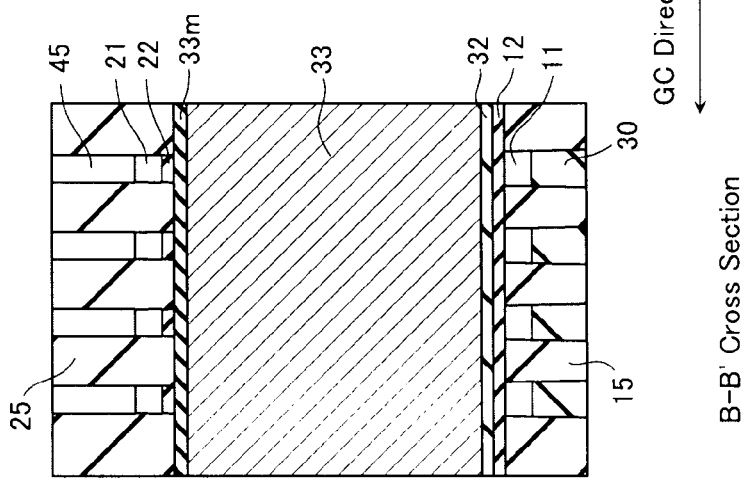
Figure 41A:
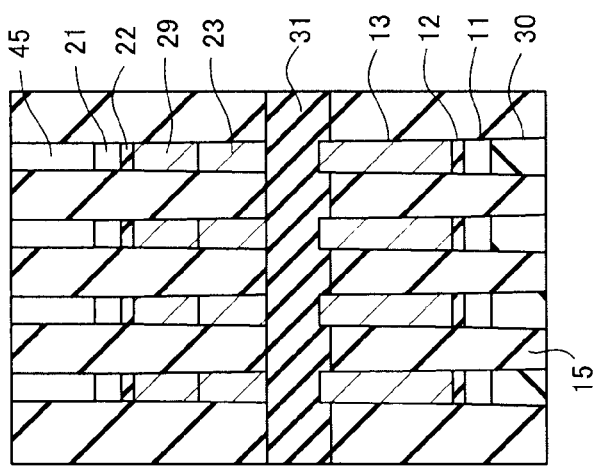

Then, as shown in FIG. 40 and FIG. 41, a second element isolating insulating layer 25 is embedded in the trenches (third trenches) of the upper layer AA pattern. Finally, through-holes are formed in end portions of the semiconductor layers 11 and 22, control gates 33, and select gate lines 17 and 27 to form contacts 35 to 38, to thereby complete two memory cell array layers 10 and 20. The material of the contacts 35 to 38 may be polysilicon and metal (W, etc.) that are used commonly.

According to the second embodiment, in addition to the effect achieved by the first embodiment, it becomes easier to maintain a flat interface between the second select gate 28 and the second tunnel insulating film 22 in the upper layer, and to give a uniform characteristic to the lower and upper select gate transistors S11 and S12, and S21 and S22 because the second select gate 28 is interposed between the second select gate line 27 and the second tunnel insulating film 22 in the upper layer.

Third Embodiment

Figure 42:
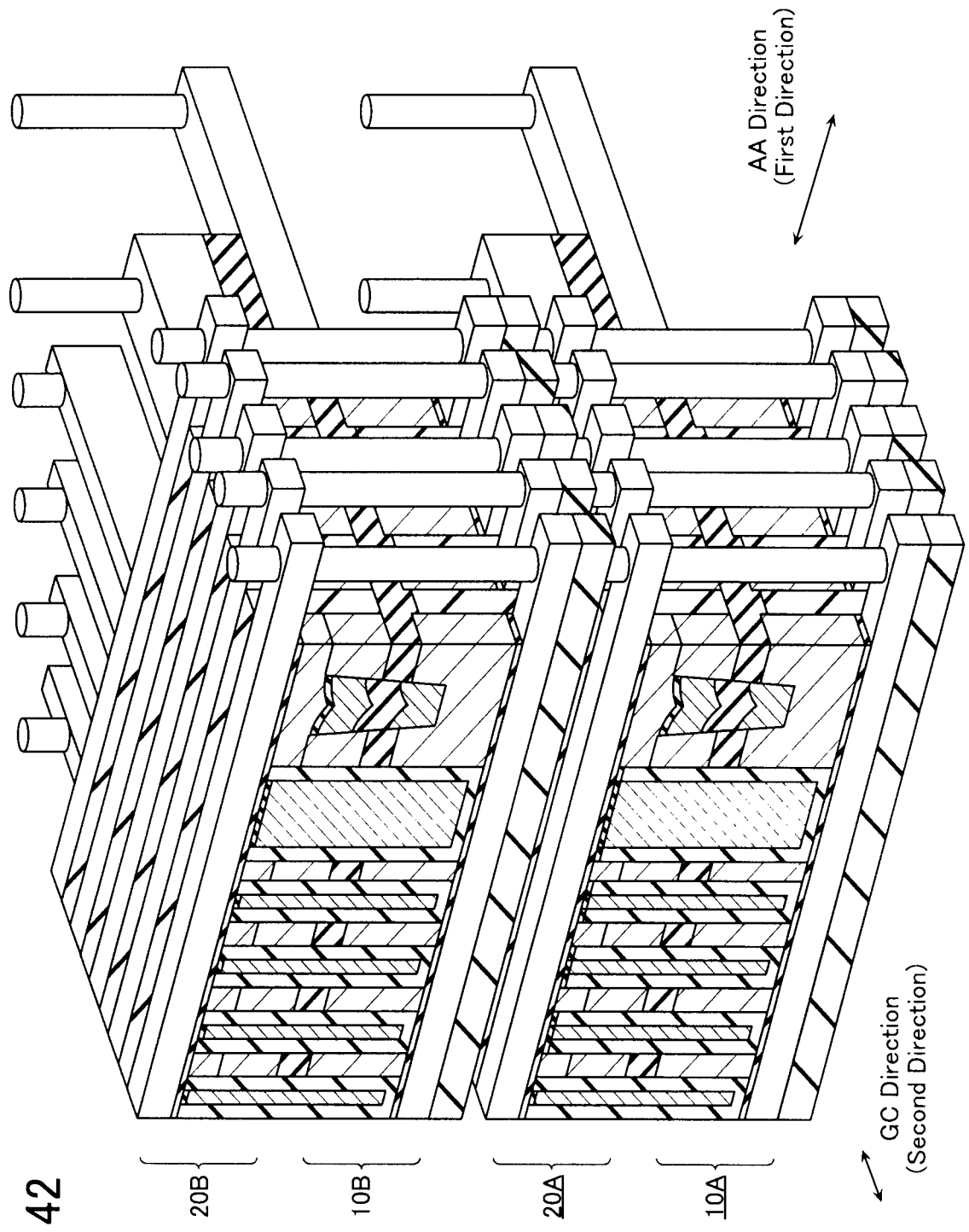
FIG. 42 is a perspective diagram showing a memory cell array structure of a nonvolatile semiconductor memory device according to a third embodiment.

FIG. 42 is a perspective diagram showing a memory cell array structure according to the third embodiment. Multilayer stacking is available by repeating the flow up to the contact formation, which is included in the above-described two-layer formation process. In the present embodiment, four memory cell array layers 10A, 20A, 10B, and 20B are stacked. Such multilayer interconnection is advantageous in that it can share the platform with a floating gate type NAND flash memory, because it can do with the three layers of bit lines, a source line, and global lines as with a single-layer floating gate type NAND flash memory, and needs no significant changes in the peripheral circuits. Note that the first semiconductor layer of the upper layer and the second semiconductor layer of the lower layer may be formed commonly.

Other Embodiments

The embodiments described above have a structure in which the control gate 33 is shared between the lower and upper memory cells MC1 and MC2. Therefore, the manufacturing process becomes simple, and wiring can be simplified. However, it is also possible to divide the control gate 33 to lower and upper portions so as to enable the lower and upper memory cells MC1 and MC2 to be controlled independently. In this case, the control gate formation process may be carried out in the same manner as the select gate formation process described above.

In the first embodiment, the second select gate line 27 of the upper layer needs not be formed in one process, but instead, the select gate line 27 may be etched back rather deeply, and polysilicon may be added thereabove as in the second embodiment. In this way, it is possible to obtain the same effect as the second embodiment.

When forming a multilayer structure, it is possible to form the AA pattern and the GC pattern alternately into two layers at a time as in an order of first layer→(second layer+third layer)→(fourth layer+fifth layer) . . . as for the AA pattern, and (first layer+second layer)→(third layer+fourth layer)→(fifth layer+sixth layer) . . . as for the GC pattern. This would further shorten the manufacturing process.

Furthermore, another method for self-alignment between the floating gate and the channel is conceivable than the method described above. For example, when forming the AA pattern, the floating gate is etched together with a sacrifice film such as a nitride film formed above the floating gate. Then, after an oxide film is embedded in the formed trenches, the sacrifice film is removed by a hot phosphoric acid treatment. Then, a second tunnel insulating film 22 and a second semiconductor layer 21 are embedded where the sacrifice film has been, and the top surface is planarized by CMP or RIE. This method can also realize self-alignment between the floating gate and the channel.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a first memory cell array layer including first NAND cell units each including a plurality of first memory cells connected in series in a first direction, the first memory cell including a first semiconductor layer, a first gate insulating film formed above the first semiconductor layer, and a first charge accumulation layer formed above the first gate insulating film;
    a first insulating layer formed above the first memory cell array layer;
    a second memory cell array layer formed above the first insulating layer and including second NAND cell units each including a plurality of second memory cells connected in series in the first direction, the second memory cell including a second charge accumulation layer, a second gate insulating film formed above the second charge accumulation layer, and a second semiconductor layer formed above the second gate insulating film; and
    control gates formed on first-direction both sides of the first and second charge accumulation layers positioned the latter above the former via the first insulating layer, with an inter-gate insulating film provided between the control gate and the charge accumulation layers, each control gate extending through the second memory cell array layer, through the first insulating layer and into the first memory cell array layer, and the control gates extending in a second direction perpendicular to the first direction.

2. The nonvolatile semiconductor memory device according to claim 1,
    wherein the first and second charge accumulation layers and the control gates are arranged alternately in the first direction.

3. The nonvolatile semiconductor memory device according to claim 1,
    wherein the plurality of first NAND cell units are insulated and isolated from each other in the second direction via a first element isolating insulating layer,
    the plurality of second NAND cell units are insulated and isolated from each other in the second direction via a second element isolating insulating layer, and
    the first NAND cell unit and the second NAND cell unit are misaligned in the second direction.

4. The nonvolatile semiconductor memory device according to claim 1, comprising:
    first select gate transistors connected to both ends of the first NAND cell unit for electrically connecting the first NAND cell unit to a bit line and a source line respectively;
    second select gate transistors connected to both ends of the second NAND cell unit for electrically connecting the second NAND cell unit to the bit line and the source line respectively,
    wherein the first and second select gate transistors are formed the latter above the former via the first insulating layer to be insulated and isolated from each other, and
    the nonvolatile semiconductor memory device further comprises first and second select gate lines which are located the latter above the former via a second insulating layer so as to be insulated and isolated from each other, and extend in the second direction.

5. The nonvolatile semiconductor memory device according to claim 4, comprising
    a conductive film made of polysilicon which is formed between the first select gate line and the first gate insulating film, and between the second select gate line and the second gate insulating film.

6. The nonvolatile semiconductor memory device according to claim 1,
    wherein a mask material is provided between the control gate and the second gate insulating film.

7. The nonvolatile semiconductor memory device according to claim 4,
    wherein a mask material is provided between the second select gate line and the second gate insulating film.

8. A nonvolatile semiconductor memory device, comprising:
    a first memory cell array layer including first NAND cell units each including a plurality of first memory cells connected in series in a first direction, the first memory cell including a first semiconductor layer, a first gate insulating film formed above the first semiconductor layer, and a first charge accumulation layer formed above the first gate insulating film;
    a first insulating layer formed above the first memory cell array layer;
    a second memory cell array layer formed above the first insulating layer and including second NAND cell units each including a plurality of second memory cells connected in series in the first direction, the second memory cell including a second charge accumulation layer, a second gate insulating film formed above the second charge accumulation layer, and a second semiconductor layer formed above the second gate insulating film; and
    control gates adjoining first-direction both sides of the first and second charge accumulation layers, with an inter-gate insulating film provided between the control gate and the charge accumulation layers, each control gate extending through the second memory cell array layer, through the first insulating layer and into the first memory cell array layer,
    the first and second charge accumulation layers being positionally aligned in the first direction.

9. The nonvolatile semiconductor memory device according to claim 8,
    wherein the first and second charge accumulation layers and the control gates are arranged alternately in the first direction.

10. The nonvolatile semiconductor memory device according to claim 8, wherein the plurality of first NAND cell units are insulated and isolated from each other in a second direction via a first element isolating insulating layer, the plurality of second NAND cell units are insulated and isolated from each other in the second direction via a second element isolating insulating layer, and the first NAND cell unit and the second NAND cell unit are misaligned in the second direction.

11. The nonvolatile semiconductor memory device according to claim 8, comprising:

first select gate transistors connected to both ends of the first NAND cell unit for electrically connecting the first NAND cell unit to a bit line and a source line respectively;

second select gate transistors connected to both ends of the second NAND cell unit for electrically connecting the second NAND cell unit to the bit line and the source line respectively, wherein the first and second select gate transistors are formed the latter above the former via the first insulating layer to be insulated and isolated from each other, and the nonvolatile semiconductor memory device further comprises first and second select gate lines which are formed the latter above the former via a second insulating layer to be insulated and isolated from each other, and extend in the second direction.

12. The nonvolatile semiconductor memory device according to claim 11, comprising a conductive film made of polysilicon which is formed between the first select gate line and the first gate insulating film, and between the second select gate line and the second gate insulating film.

13. The nonvolatile semiconductor memory device according to claim 8, wherein a mask material is provided between the control gate and the second gate insulating film.

14. The nonvolatile semiconductor memory device according to claim 11, wherein a mask material is provided between the second select gate line and the second gate insulating film.

15. A method for manufacturing a nonvolatile semiconductor memory device, comprising:

forming a first gate insulating film and a first charge accumulation layer forming layer sequentially above a first semiconductor layer;

forming first trenches into the first charge accumulation layer forming layer, the first gate insulating film, and the first semiconductor layer such that the first trenches extend in a first direction and are at certain intervals in a second direction perpendicular to the first direction;

embedding a first element isolating insulating layer into the first trenches and forming a first insulating layer above the first charge accumulation layer forming layer and the first element isolating insulating layer;

forming a second charge accumulation layer forming layer above the first insulating layer;

forming second trenches into the second charge accumulation layer forming layer, the first insulating layer, and the first charge accumulation layer forming layer such that the second trenches extend in the second direction and are at certain intervals in the first direction, to thereby form first charge accumulation layers in the first charge accumulation layer forming layer;

after forming an inter-gate insulating film in the second trenches, embedding control gates in the second trenches;

forming third trenches into the second charge accumulation layer forming layer such that the third trenches extend in the first direction and are at certain intervals in the second direction, to thereby form second charge accumulation layers in the second charge accumulation layer forming layer; and embedding a second element isolating insulating film in the third trenches.

16. The method for manufacturing a nonvolatile semiconductor memory device according to claim 15, comprising:

forming first select gates at the same time as forming the second trenches to form the first charge accumulation layers;

after embedding the control gates in the second trenches and before forming the third trenches into the second charge accumulation layer forming layer, forming select gate trenches into the second charge accumulation layer forming layer, the first insulating layer, and the first charge accumulation layer forming layer at positions corresponding to the first select gates such that the first charge accumulation layer forming layer remains between the select gate trenches and the first gate insulating film and the select gate trenches extend in the second direction, and embedding a first select gate line, a second insulating layer, and a second select gate line in the select gate trenches sequentially such that the first insulating layer and the second insulating layer become continuous in the first direction; and forming second select gates at the same time as forming the third trenches to form the second charge accumulation layers.

17. The method for manufacturing a nonvolatile semiconductor memory device according to claim 15, comprising:

after forming the first insulating layer and before forming the second charge accumulation layer forming layer, forming first select gate trenches into the first insulating layer and the first charge accumulation layer forming layer at positions corresponding to first and second select gates such that the first charge accumulation layer forming layer remains between the first select gate trenches and the first gate insulating film and the first select gate trenches extend in the second direction, and embedding a first select gate line and a second insulating layer sequentially in the first select gate trenches;

after forming the second charge accumulation layer forming layer and before forming the second trenches, forming second select gate trenches into the second charge accumulation layer forming layer at the positions corresponding to the first and second select gates such that the second insulating layer remains between the second select gate trenches and the first select gate line and the second select gate trenches extend in the second direction, embedding a second select gate line in the second select gate trenches, and forming a third charge accumulation layer forming layer above the second charge accumulation layer e forming layer and the second select gate line;

when forming the second trenches into the second charge accumulation layer forming layer, the first insulating layer, and the first charge accumulation layer forming layer, also forming the second trenches into the third charge accumulation layer forming layer, to thereby form first select gates at the same time as the first charge accumulation layers; and when forming the third trenches into the second charge accumulation layer forming layer, also forming the third trenches into the third charge accumulation layer forming layer, to thereby form second select gates at the same time as the second charge accumulation layers.

18. The method for manufacturing a nonvolatile semiconductor memory device according to claim 15, comprising:
before forming the third trenches, forming a second gate insulating film and a second semiconductor layer above an uppermost charge accumulation layer forming layer and the control gates; and
when forming the third trenches into the second charge accumulation layer forming layer, also forming the third trenches into the second semiconductor layer and the second gate insulating film, to thereby form the second semiconductor layer and the second gate insulating film at the same time as the second charge accumulation layers.

19. The method for manufacturing a nonvolatile semiconductor memory device according to claim 15, comprising:
before forming the third trenches, forming a sacrifice film above an uppermost charge accumulation layer forming layer and the control gates;
when forming the third trenches into the second charge accumulation layer forming layer, also forming the third trenches into the sacrifice film;
after embedding the second element isolating insulating film in the third trenches, removing the sacrifice film; and
forming a second gate insulating film and a second semiconductor layer above an upper surface of the second charge accumulation layers exposed by removing the sacrifice film.

20. The method for manufacturing a nonvolatile semiconductor memory device according to claim 15, comprising
when further forming an upper nonvolatile semiconductor memory device above a lower nonvolatile semiconductor memory device, forming the first trenches of the upper device and the third trenches of the lower device substantially at the same time.

* * * * *